United States Patent
Shimoju et al.

(10) Patent No.: US 11,401,361 B2
(45) Date of Patent: Aug. 2, 2022

(54) CURABLE COMPOSITION FOR IMPRINTING, CURED PRODUCT, PATTERN FORMING METHOD, LITHOGRAPHY METHOD, PATTERN, MASK FOR LITHOGRAPHY, AND POLYMERIZABLE COMPOSITION FOR IMPRINTING

(71) Applicant: FUJIFILM Corporation, Tokyo (JP)

(72) Inventors: Naoya Shimoju, Haibara-gun (JP); Akinori Shibuya, Haibara-gun (JP); Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 88 days.

(21) Appl. No.: 16/750,585

(22) Filed: Jan. 23, 2020

(65) Prior Publication Data

US 2020/0157267 A1    May 21, 2020

Related U.S. Application Data

(63) Continuation of application No. PCT/JP2018/028019, filed on Jul. 26, 2018.

(30) Foreign Application Priority Data

Jul. 26, 2017 (JP) .............................. JP2017-144530

(51) Int. Cl.
*C08F 222/16* (2006.01)
*G03F 7/00* (2006.01)
*H01L 21/027* (2006.01)

(52) U.S. Cl.
CPC .......... *C08F 222/16* (2013.01); *G03F 7/0002* (2013.01); *H01L 21/0273* (2013.01)

(58) Field of Classification Search
None
See application file for complete search history.

(56) References Cited

U.S. PATENT DOCUMENTS

| 5,134,175 | A | * | 7/1992 | Lucey | ................... | C08F 290/08 |
|---|---|---|---|---|---|---|
| | | | | | | 522/103 |
| 2010/0244328 | A1 | * | 9/2010 | Yonezawa | .................. | C08J 3/28 |
| | | | | | | 264/447 |
| 2011/0059302 | A1 | * | 3/2011 | Kodama | ................. | C08F 20/38 |
| | | | | | | 428/195.1 |
| 2013/0127090 | A1 | * | 5/2013 | Yamada | ................ | B29C 59/005 |
| | | | | | | 264/293 |
| 2014/0374884 | A1 | | 12/2014 | Kitagawa et al. | | |
| 2016/0215074 | A1 | | 7/2016 | Honma et al. | | |
| 2017/0183437 | A1 | | 6/2017 | Kato et al. | | |
| 2017/0210837 | A1 | | 7/2017 | Ito et al. | | |
| 2017/0369418 | A1 | | 12/2017 | Tanaka et al. | | |

FOREIGN PATENT DOCUMENTS

| CA | 2026627 A1 | * | 4/1991 |
|---|---|---|---|
| JP | 2001-530 A | | 1/2001 |
| JP | 2001322361 A | * | 11/2001 |
| JP | 2009-244402 A | | 10/2009 |
| JP | 2011-066370 A | | 3/2011 |
| JP | 2011-251508 A | | 12/2011 |
| JP | 2013-189537 A | | 9/2013 |
| JP | 2015-130535 A | | 7/2015 |
| JP | 2015-179807 A | | 10/2015 |
| JP | 2016-029138 A | | 3/2016 |
| JP | 2016-030829 A | | 3/2016 |
| KR | 10-2010-0107407 A | | 10/2010 |
| WO | 2016/129490 A1 | | 8/2016 |
| WO | 2016/152600 A1 | | 9/2016 |

OTHER PUBLICATIONS

JP2001322361 English Machine Translation, prepared Dec. 3, 2021. (Year: 2021).*
International Search Report dated Oct. 9, 2018, issued by the International Searching Authority in application No. PCT/JP2018/028019.
Written Opinion dated Oct. 9, 2018, issued by the International Searching Authority in application No. PCT/JP2018/028019.
International Preliminary Report on Patentability dated Jan. 28, 2020, issued by the International Bureau in application No. PCT/JP2018/028019.
Office Action from the Japanese Patent Office dated Oct. 13, 2020 in Japanese Application No. 2019-532849.
Office Action dated Aug. 3, 2021 by the Korean Patent Office in Korean application No. 10-2020-7001482.
Office Action dated Feb. 11, 2022 from the Korean Patent Office in KR Application No. 10-2020-7001482.
Office Action dated Jan. 12, 2022 from the Taiwanese Intellectual Property Office in TW Application No. 107125401.

* cited by examiner (Continued)

*Primary Examiner* — Christopher M Rodd
(74) *Attorney, Agent, or Firm* — Sughrue Mion, PLLC

(57) ABSTRACT

The curable composition for imprinting includes: a compound represented by the following Formula (1); a radically polymerizable compound other than the compound represented by Formula (1); and a photoradical polymerization initiator, in Formula (1), $R^1$ and $R^2$ each independently represent a hydrogen atom or an organic group having 1 to 8 carbon atoms and may be bonded to each other to form a ring, $R^3$ represents a monovalent organic group, and $R^4$ and $R^5$ each independently represent a hydrogen atom or a monovalent organic group.

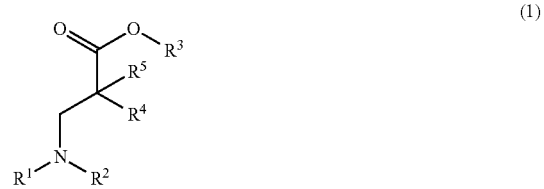

(1)

19 Claims, No Drawings

CURABLE COMPOSITION FOR IMPRINTING, CURED PRODUCT, PATTERN FORMING METHOD, LITHOGRAPHY METHOD, PATTERN, MASK FOR LITHOGRAPHY, AND POLYMERIZABLE COMPOSITION FOR IMPRINTING

CROSS-REFERENCE TO RELATED APPLICATIONS

This application is a Continuation of PCT International Application No. PCT/JP2018/028019 filed on Jul. 26, 2018, which claims priority under 35 U.S.C § 119(a) to Japanese Patent Application No. 2017-144530 filed on Jul. 26, 2017. Each of the above application(s) is hereby expressly incorporated by reference, in its entirety, into the present application.

BACKGROUND OF THE INVENTION

1. Field of the Invention

The present invention relates to a curable composition for imprinting, a cured product, a pattern forming method, a lithography method, a pattern, a mask for lithography, and a polymerizable composition for imprinting.

2. Description of the Related Art

An imprint method is a technique of transferring a fine pattern to a material by pressing a mold (in general, referred to as "mold" or "stamper") on which a pattern is formed against the material. By using the imprint method, a fine pattern can be formed easily and accurately. Therefore, recently, the application of the imprint method to various fields has been expected. In particular, a nanoimprint technique of forming a fine pattern on a nano-order level has attracted attention.

As the imprint method, methods called a thermal imprint method and a photoimprint method have been proposed depending on a transfer method. In the thermal imprint method, a fine pattern is formed by pressing a mold against a thermoplastic resin heated to a glass transition temperature (hereinafter, also referred to as "Tg") or higher, cooling the thermoplastic resin, and releasing the mold. In this method, various materials can be selected, but there are problems in that a high pressure is required during pressing and it is difficult to form a fine pattern due to thermal shrinkage or the like.

On the other hand, in the photoimprint method, a curable composition for imprinting is photocured in a state where a mold is pressed against the curable composition for imprinting, and then the mold is released. Since this photoimprint method is an imprint method for an uncured product, a fine pattern can be simply formed without requiring high-pressure and high-temperature heating.

In the photoimprint method, a curable composition for imprinting is applied to a substrate (on which an adhesion treatment is optionally performed), and a mold formed of a light-transmitting material such as quartz is pressed against the curable composition for imprinting. In a case where the mold is pressed against the curable composition for imprinting, the curable composition for imprinting is cured by light irradiation, and then the mold is released. As a result, a cured product to which a desired pattern is transferred is prepared.

Examples of a method of applying the curable composition for imprinting to the substrate include a spin coating method and an ink jet method. In particular, the ink jet method is an application method that has recently attracted attention from the viewpoint of a small loss of the curable composition for imprinting.

In addition, a method of performing microfabrication using a transferred imprint pattern as a mask is called nanoimprint lithography (NIL), and has been developing as the next-generation lithography technique in place of the current ArF immersion process. Therefore, as in the case of an extreme ultraviolet (EUV) resist, a curable composition for imprinting used in NIL is required to have resolution ability of an ultrafine pattern having a size of 30 nm or less and high etching resistance as a mask during microfabrication of an object to be processed. Further, since throughput (productivity) is also emphasized during mass-production, nanoimprint suitability such as pattern filling properties (filling time reduction) and mold releasability (mold releasing time reduction) is also required.

As patent documents that disclose curable compositions for imprinting having excellent etching resistance, filling properties, and releasability, JP2015-179807A, JP2016-029138A, JP2016-030829A, JP2013-189537A, JP2011-251508A and JP2015-130535A are known. In JP2015-179807A, JP2016-029138A, and JP2016-030829A, phenyl ethylene glycol diacrylate is used as an acrylate monomer having high etching resistance. In addition, in JP2013-189537A, a polyfunctional acrylate having at least one of an alicyclic structure or an aromatic ring structure is used. Further, in JP2011-251508A and JP2015-130535A, an acrylate monomer including silicon is used in order to improve etching resistance.

SUMMARY OF THE INVENTION

However, the present inventor conducted a thorough investigation on the above-described patent documents and found that, in a case where imprint lithography is performed using the curable composition for imprinting described in any one of the patent documents, adhesiveness with a substrate may be insufficient or the storage stability of the curable composition for imprinting itself may be poor.

An object of the present invention is to solve the above-described problems and to provide a curable composition for imprinting having excellent storage stability with which a cured product having high adhesiveness with a substrate can be obtained, a cured product, a pattern forming method, a lithography method, a pattern, a mask for lithography, and a polymerizable composition for imprinting.

In order to achieve the object, the present inventors conducted an investigation and found that the object can be achieved by adding a predetermined compound. Specifically, the above-described object can be achieved using the following means <1>, preferably <2> to <20>.

<1> A curable composition for imprinting comprising:
a compound represented by the following Formula (1);
a radically polymerizable compound other than the compound represented by Formula (1); and
a photoradical polymerization initiator,

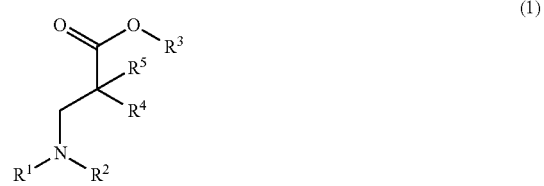

(1)

in Formula (1), $R^1$ and $R^2$ each independently represent a hydrogen atom or an organic group having 1 to 8 carbon atoms and may be bonded to each other to form a ring, $R^3$ represents a monovalent organic group, and $R^4$ and $R^5$ each independently represent a hydrogen atom or a monovalent organic group.

<2> The curable composition for imprinting according to <1>, in which a content of the compound represented by Formula (1) is 0.005 to 1 part by mass with respect to 100 parts by mass of the radically polymerizable compound other than the compound represented by Formula (1).

<3> The curable composition for imprinting according to <1> or <2>, in which the radically polymerizable compound other than the compound represented by Formula (1) includes at least one (meth)acryloyl group.

<4> The curable composition for imprinting according to any one of <1> to <3>, in which a molecular weight of the compound represented by Formula (1) is 100 to 1500.

<5> The curable composition for imprinting according to any one of <1> to <4>, in which the compound represented by Formula (1) has a radically polymerizable group.

<6> The curable composition for imprinting according to any one of <1> to <5>, in which $R^4$ or $R^5$ in Formula (1) is represented by the following Formula (1-3),

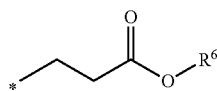

(1-3)

in Formula (1-3), $R^6$ represents a monovalent organic group and represents a binding site.

<7> The curable composition for imprinting according to <6>, in which $R^3$ in Formula (1) and $R^6$ in Formula (1-3) are each independently represented by the following Formula (1-1),

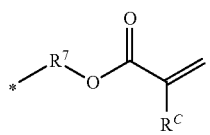

(1-1)

in the formula, $R^7$ represents a divalent organic group, $R^C$ represents a hydrogen atom or a methyl group, and * represents a binding site.

<8> The curable composition for imprinting according to any one of <1> to <7>, in which at least one radically polymerizable compound other than the compound represented by Formula (1) includes a compound represented by the following Formula (2),

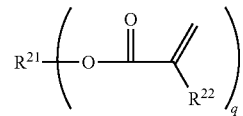

(2)

in Formula (2), $R^{21}$ represents a q-valent organic group, $R^{22}$ represents a hydrogen atom or a methyl group, and q represents an integer of 2 or more.

<9> The curable composition for imprinting according to any one of <1> to <8>, in which at least one radically polymerizable compound other than the compound represented by Formula (1) is a monofunctional (meth)acrylic monomer.

<10> The curable composition for imprinting according to any one of <1> to <9>, in which a content of a solvent in the curable composition for imprinting is 5 mass % or lower.

<11> The curable composition for imprinting according to any one of <1> to <10>, in which a content of a component having a weight-average molecular weight of higher than 2000 in the curable composition for imprinting is 5 mass % or lower.

<12> The curable composition for imprinting according to any one of <1> to <11>, in which a viscosity of the curable composition for imprinting at 25° C. is 3 to 15 mPa·s.

<13> A cured product which is formed of the curable composition for imprinting according to any one of <1> to <12>.

<14> The cured product according to <13>, which is provided on a silicon substrate.

<15> A pattern forming method comprising:

applying the curable composition for imprinting according to any one of <1> to <12> to a substrate or a mold; and irradiating the curable composition for imprinting with light in a state where the curable composition for imprinting is interposed between the mold and the substrate.

<16> The pattern forming method according to <15>, wherein a size of the pattern is 30 nm or less.

<17> A method of manufacturing a substrate to be processed comprising:

performing etching by using a pattern which is obtained using the pattern forming method according to <15> or <16> as a mask.

<18> A pattern which is formed of the curable composition according to any one of <1> to <12>, wherein a size of the pattern is 30 nm or less.

<19> A mask for etching comprising:

at least one pattern according to <18>.

<20> A polymerizable composition for imprinting comprising:

a compound represented by the following Formula (1); and a compound represented by the following Formula (2),

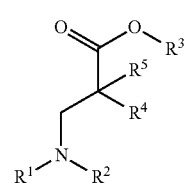

(1)

in Formula (1), $R^1$ and $R^2$ each independently represent a hydrogen atom or an organic group having 1 to 8 carbon atoms and may be bonded to each other to form a ring, $R^3$ represents a monovalent organic group, and $R^4$ and $R^5$ each independently represent a hydrogen atom or a monovalent organic group, and

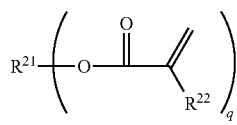
(2)

in Formula (2), $R^{21}$ represents a q-valent organic group, $R^{22}$ represents a hydrogen atom or a methyl group, and q represents an integer of 2 or more.

With the present invention, it is possible to provide a curable composition for imprinting having excellent storage stability with which a cured product having high adhesiveness with a substrate can be obtained, a cured product, a pattern forming method, a lithography method, a pattern, a mask for lithography, and a polymerizable composition for imprinting.

DESCRIPTION OF THE PREFERRED EMBODIMENTS

Hereinafter, the details of the present invention will be described. In this specification of the present application, numerical ranges represented by "to" include numerical values before and after "to" as lower limit values and upper limit values.

In this specification, "(meth)acrylate" denotes acrylate and methacrylate, "(meth)acryl" denotes acryl and methacryl, and "(meth)acryloyl" denotes acryloyl and methacryloyl. "(meth)acryloyloxy" denotes acryloyloxy and methacryloyloxy.

In this specification, "imprint" denotes preferably transfer of a pattern having a size of 1 nm to 10 mm and more preferably transfer of a pattern having a size of about 10 nm to 100 μm (nanoimprint).

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "light" refers to not only light in ultraviolet, near-ultraviolet, far-ultraviolet, visible, infrared wavelength ranges but also an electromagnetic wave and radiation. Examples of the radiation include a microwave, an electron beam, extreme ultraviolet (EUV) radiation, and an X-ray. In addition, laser light such as 248 nm excimer laser light, 193 urn excimer laser light, or 172 nm excimer laser light can also be used. As these light components, monochromatic light (single-wavelength light) having passed through an optical filter may also be used, or light (complex light) having a plurality of different wavelengths may also be used.

In this specification, a total solid content denotes the total mass of all the components of the composition excluding a solvent.

Unless specified otherwise, an atmospheric pressure during boiling point measurement in the present invention denotes 101325 Pa (1 atm). Unless specified otherwise, in the present invention, a temperature refers to 25° C.

In this specification, the term "step" denotes not only an individual step but also a step which is not clearly distinguishable from another step as long as an effect expected from the step can be achieved.

In this specification, unless specified otherwise, "weight-average molecular weight (Mw)" and "number-average molecular weight (Mn)" are defined as values in terms of polystyrene obtained by measurement of gel permeation chromatography (GPC). In this specification, the weight-average molecular weight (Mw) and the number-average molecular weight (Mn) can be obtained, for example, by using HLC-8220 (manufactured by Tosoh Corporation) and using a guard column HZ-L, TSK gel Super HZM-M, TSK gel Super HZ4000, TSK gel Super HZ3000, or TSK gel Super HZ2000 (manufactured by Tosoh Corporation) as a column. Unless specified otherwise, tetrahydrofuran (THF) is used as an eluent for measurement. In addition, unless specified otherwise, a detector that detects ultraviolet light (UV light) having a wavelength of 254 nm is used for detection.

A curable composition for imprinting according to an embodiment of the present invention comprises: a compound represented by the following Formula (1); a radically polymerizable compound other than the compound represented by Formula (1) (hereinafter, also simply referred to as "other radically polymerizable compound" or "polymerizable compound not having an aminomethyl group"); and a photoradical polymerization initiator.

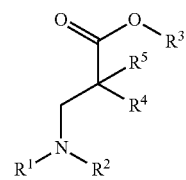
(1)

In Formula (1), $R^1$ and $R^2$ each independently represent a hydrogen atom or an organic group having 1 to 8 carbon atoms and may be bonded to each other to form a ring, $R^3$ represents a monovalent organic group, and $R^4$ and $R^5$ each independently represent a hydrogen atom or a monovalent organic group.

With this configuration, a curable composition for imprinting having excellent storage stability before curing with which a cured product having excellent adhesiveness with a substrate can be obtained can be provided. Further, preferably, a curable composition for imprinting also having mold releasability can be provided.

This mechanism is presumed to be that an amino group ($R^1R^2N$—; the portion <ii> in the following formula) has an action of improving adhesiveness with a substrate, and a radical generated in a methylene group (—CH2-; the portion <i> in the following formula) has an action of trapping an active oxygen species in the system that makes the composition unstable (refer to the following Formula 1a).

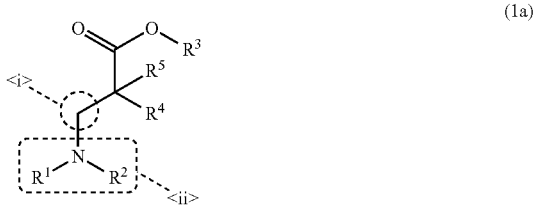

Hereinafter, the details of the present invention will be described.

<Compound Represented by Formula (1)>

The curable composition for imprinting according to the embodiment of the present invention includes the compound represented by Formula (1). It is preferable that the compound represented by Formula (1) has a radically polymerizable group. By having a radically polymerizable group, the compound represented by Formula (1) becomes a part of a cured product such that the adhesive strength with a resist tends to be further improved. A preferable example of the radically polymerizable group has the same definition as that described below regarding $R^3$. The number of radically polymerizable groups in one molecule of the compound represented by Formula (1) is preferably 1 to 5, more preferably 2 to 5, still more preferably 2 or 3, and still more preferably 2.

In Formula (1), $R^1$ and $R^2$ each independently represent a hydrogen atom or an organic group having 1 to 8 atoms, preferably a hydrogen atom or an alkyl group having 1 to 8 carbon atoms, more preferably a hydrogen atom, a methyl group, an ethyl group, an n-propyl group, an isopropyl group, or a benzyl group, still more preferably a hydrogen atom, a methyl group, or an ethyl group, still more preferably a methyl group or an ethyl group, and still more preferably an ethyl group. $R^1$ and $R^2$ may have or may not have the following substituent T within a range where the effects of the present invention do not deteriorate. In the present invention, it is preferable that $R^1$ and $R^2$ have a substituent. In a case where $R^1$ and $R^2$ have a substituent, the substituent is preferably an aryl group.

In one embodiment of the present invention, $R^1$ and $R^2$ represent the same group. With the above-described configuration, the effects of the present invention tend to be more effectively exhibited.

Examples of the substituent T include a linear or branched alkyl group (having preferably 1 to 24 carbon atoms, more preferably 1 to 12 carbon atoms, and still more preferably 1 to 6 carbon atoms), a cycloalkyl group (having preferably 3 to 24 carbon atoms, more preferably 3 to 12 carbon atoms, and still more preferably 3 to 6 carbon atoms), an aralkyl group (having preferably 7 to 21 carbon atoms, more preferably 7 to 15 carbon atoms, and still more preferably 7 to 11 carbon atoms), a linear or branched alkenyl group (having preferably 2 to 24 carbon atoms, more preferably 2 to 12 carbon atoms, and still more preferably 2 to 6 carbon atoms), a cycloalkenyl group (having preferably 3 to 24 carbon atoms, more preferably 3 to 12 carbon atoms, and still more preferably 3 to 6 carbon atoms), a hydroxyl group, a hydroxylalkyl group (having preferably 1 to 24 carbon atoms, more preferably 1 to 12 carbon atoms, and still more preferably 1 to 6 carbon atoms; having preferably 1 to 6 hydroxyl groups and more preferably 1 to 3 hydroxyl groups; the alkyl group may be linear, branched, chain-like, or cyclic), a hydroxylalkenyl group (having preferably 2 to 24 carbon atoms, more preferably 2 to 12 carbon atoms, and still more preferably 2 to 6 carbon atoms; having preferably 1 to 6 hydroxyl groups and more preferably 1 to 3 hydroxyl groups; the alkenyl group may be linear, branched, chain-like, or cyclic), an amino group (having preferably 0 to 24 carbon atoms, more preferably 0 to 12 carbon atoms, and still more preferably 0 to 6 carbon atoms), an aminoalkyl group (having preferably 1 to 24 carbon atoms, more preferably 1 to 12 carbon atoms, and still more preferably 1 to 6 carbon atoms; having preferably 1 to 6 amino groups and more preferably 1 to 3 amino groups; the alkyl group may be linear, branched, chain-like, or cyclic), an aminoalkenyl group (having preferably 2 to 24 carbon atoms, more preferably 2 to 12 carbon atoms, and still more preferably 2 to 6 carbon atoms; having preferably 1 to 6 amino groups and more preferably 1 to 3 amino groups; the alkenyl group may be linear, branched, chain-like, or cyclic), a thiol group, an thiolalkyl group (having preferably 1 to 24 carbon atoms, more preferably 1 to 12 carbon atoms, and still more preferably 1 to 6 carbon atoms; having preferably 1 to 6 thiol groups and more preferably 1 to 3 thiol groups; the alkyl group may be linear, branched, chain-like, or cyclic), an thiolalkenyl group (having preferably 2 to 24 carbon atoms, more preferably 2 to 12 carbon atoms, and still more preferably 2 to 6 carbon atoms; having preferably 1 to 6 thiol groups and more preferably 1 to 3 thiol groups; the alkenyl group may be linear, branched, chain-like, or cyclic), a carboxyl group, a carboxyalkyl group (having preferably 1 to 24 carbon atoms, more preferably 1 to 12 carbon atoms, and still more preferably 1 to 6 carbon atoms; having preferably 1 to 6 carboxyl groups and more preferably 1 to 3 carboxyl groups; the alkyl group may be linear, branched, chain-like, or cyclic), a carboxyalkenyl group (having preferably 2 to 24 carbon atoms, more preferably 2 to 12 carbon atoms, and still more preferably 2 to 6 carbon atoms; having preferably 1 to 6 carboxyl groups and more preferably 1 to 3 carboxyl groups; the alkenyl group may be linear, branched, chain-like, or cyclic), an aryl group (having preferably 6 to 22 carbon atoms, more preferably 6 to 18 carbon atoms, and still more preferably 6 to 10 carbon atoms), an acyl group (having preferably 2 to 12 carbon atoms, more preferably 2 to 6 carbon atoms, and still more preferably 2 or 3 carbon atoms), an acyloxy group (having preferably 2 to 12 carbon atoms, more preferably 2 to 6 carbon atoms, and still more preferably 2 or 3 carbon atoms), an aryloyl group (having preferably 7 to 23 carbon atoms, more preferably 7 to 19 carbon atoms, and still more preferably 7 to 11 carbon atoms), an aryloyloxy group (having preferably 7 to 23 carbon atoms, more preferably 7 to 19 carbon atoms, and still more preferably 7 to 11 carbon atoms), a heterocyclic group (having preferably 1 to 12 carbon atoms, more preferably 1 to 8 carbon atoms, and still more preferably 2 to 5 carbon atoms; having preferably a 5- or 6-membered ring), a (meth)acryloyl group, a (meth)acryloyloxy group, an (meth)acryloyloxyalkyl group (having preferably 1 to 24 carbon atoms, more preferably 1 to 12 carbon atoms, and still more preferably 1 to 6 carbon atoms; the alkyl group may be linear, branched, chain-like, or cyclic), a halogen atom (for example, a fluorine atom, a chlorine atom, a bromine atom, or an iodine atom), an oxo group (=O), an imino group (=$NR^N$), and an alkylidene group (=$C(R^N)_2$). $R^N$ represents a hydrogen atom or an alkyl group (preferably an alkyl group having 1 to 12 carbon atoms, more preferably an alkyl group having 1 to 6 carbon atoms, still more preferably an alkyl group having 1 to 3 carbon atoms, and still more preferably a methyl group).

$R^3$ represents a monovalent organic group, preferably an organic group having 1 to 40 carbon atoms, more preferably an organic group having 2 to 30 carbon atoms, and still more preferably an organic group having 3 to 20 carbon atoms and may have 6 to 20 carbon atoms. It is preferable that $R^3$ has one or two (preferably one) radically polymerizable group, and it is preferable that $R^3$ has the same radically polymerizable group as the radically polymerizable group included in the other radically polymerizable compound. It is more preferable that $R^3$ represents an organic group included in the other radically polymerizable compound. Examples of the radically polymerizable group include a vinyiphenyl group, a vinyl group, a (meth)acryloyl group, and a group having an ethylenically unsaturated bond such as an allyl group. Among these, a (meth)acryloyl group is preferable, and an acryloyl group is more preferable. By using a (meth)acryloyl group, adhesiveness between a substrate and the curable composition for imprinting tends to be further improved.

It is preferable that $R^3$ is represented by the following Formula (1-1).

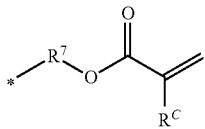

(1-1)

In the formula, $R^7$ represents a divalent organic group, $R^C$ represents a hydrogen atom or a methyl group, and * represents a binding site.

With this configuration, adhesiveness between a substrate and the curable composition for imprinting tends to be further improved.

It is preferable that $R^C$ represents a hydrogen atom.

It is preferable that the organic group represented by $R^7$ is a linking group represented by the following Formula (1-2).

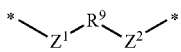

(1-2)

In the formula, it is preferable that $Z^1$ and $Z^2$ each independently represent a single bond, -Alk-, or -AlkO—. Alk represents an alkylene group (preferably having 1 to 12 carbon atoms, more preferably 1 to 6 carbon atoms, and still more preferably 1 to 3 carbon atoms), and may have the substituent T within a range where the effects of the present invention do not deteriorate. Preferable examples of the substituent include groups having the same definitions as those of $R^{101}$ to $R^{117}$ described below. O (oxygen atom) in -AlkO— is linked to the $R^9$ side.

It is preferable that $R^9$ represents a single bond, a linking group selected from the following Formulae (9-1) to (9-10), or a combination thereof. Among these, a linking group selected from Formula (9-1) to (9-3), (9-7), and (9-8) is preferable.

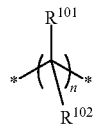

9-1

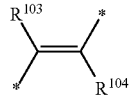

9-2

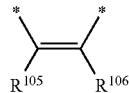

9-3\

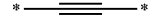

9-4

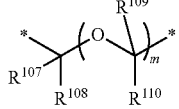

9-5

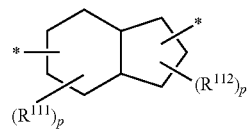

9-6

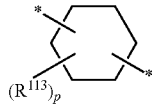

9-7

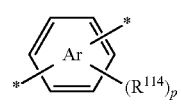

9-8

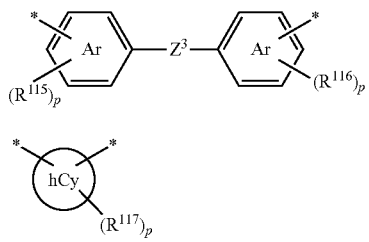

9-9

9-10

$R^{101}$ to $R^{117}$ represent any substituent and preferably the substituent T. Among these, an alkyl group (having preferably 1 to 12 carbon atoms, more preferably 1 to 6 carbon atoms, and still more preferably 1 to 3 carbon atoms), an aralkyl group (having preferably 7 to 21 carbon atoms, more preferably 7 to 15 carbon atoms, and still more preferably 7 to 11 carbon atoms), an aryl group (having preferably 6 to 22 carbon atoms, more preferably 6 to 18 carbon atoms, and still more preferably 6 to 10 carbon atoms), a thienyl group, a furyl group, a (meth)acryloyl group, a (meth)acryloyloxy group, or a (meth)acryloyloxyalkyl group (the alkyl group has preferably 1 to 24 carbon atoms, more preferably 1 to 12 carbon atoms, and still more preferably 1 to 6 carbon atoms) is preferable. $R^{101}$ and $R^{102}$, $R^{103}$ and $R^{104}$, $R^{105}$ and $R^{106}$, $R^{107}$ and $R^{108}$, $R^{109}$ and $R^{110}$, a plurality of $R^{111}$'s, a plurality of $R^{112}$'s, a plurality of $R^{113}$'s, a plurality of $R^{114}$'s, a plurality of $R^{115}$'s, a plurality of $R^{116}$'s, or a plurality of $R^{117}$'s may be bonded to each other to form a ring. In a case where the ring is formed, examples of a linking group include examples of a linking group L described below. In particular, an alkylene group (preferably having 1 to 12 carbon atoms, more preferably 1 to 6 carbon atoms, and still more preferably 1 to 3 carbon atoms) is preferable. For example, the cyclohexane ring represented by Formulae (9-6) and (9-7) may form a norbornane ring or an adamantane ring. $R^{101}$ to $R^{117}$ may further have the substituent T within a range where the effects of the present invention do not deteriorate.

In a case where $R^9$ has a ring structure, it is also preferable that the ring structure is a structure including an alicyclic ring or an aromatic ring described below regarding "(3) Alicyclic Ring or Aromatic Ring Substituted with Linear or Branched Alkyl Group having 5 or more Carbon Atoms".

Examples of the linking group L include a linear or branched alkylene group (having preferably 1 to 24 carbon atoms, more preferably 1 to 12 carbon atoms, and still more preferably 1 to 6 carbon atoms), a linear or branched alkenylene group (having preferably 2 to 24 carbon atoms, more preferably 2 to 12 carbon atoms, and still more preferably 2 to 6 carbon atoms), —O—, —S—, —CO—, —NR$^N$CO—, and a linking group relating to a combination thereof. $R^N$ has the same definition as described above. The number of atoms included in the linking group L is preferably 1 to 24, more preferably 1 to 12, and still more preferably 1 to 6.

p represents 0 or more which is an integer less than or equal to the maximum number of substituents that can be carried by each ring. In the respective cases, the upper limit values are each independently preferably half or less of the maximum number of substituents, more preferably 4 or less, and still more preferably 2 or less.

* represents a binding site.

Ar represents an arylene group (preferably having 6 to 22 carbon atoms, more preferably 6 to 18 carbon atoms, and still more preferably 6 to 10 carbon atoms), and specific examples thereof include a phenylene group, a naphthalenediyl group, an anthracenediyl group, a phenanthrenediyl group, a fluorenediyl group.

$Z^3$ represents a single bond or the examples of the linking group L. In particular, it is preferable that $Z^3$ represents a single bond, —O—, or an alkylene group (preferably an alkylene group having 1 to 6 carbon atoms, more preferably an alkylene group having 1 to 3 carbon atoms, and still more preferably a methylene group or a 2,2-propylenediyl group). In a case where $Z^3$ represents an alkylene group, the alkylene group may be substituted with the substituent T and, in particular, may be substituted with a halogen atom (in particular, a fluorine atom).

hCy represents a heterocyclic group (having preferably 1 to 12 carbon atoms, more preferably 1 to 6 carbon atoms, and still more preferably 2 to 5 carbon atoms) and preferably a 5- or 6-membered ring). Specific examples of the heterocycle constituting hCy include a thiophene ring, a furan ring, a dibenzofuran ring, a carbazole ring, an indole ring, a tetrahydropyran ring, a tetrahydrofuran ring, a pyrrole ring, a pyridine ring, a pyrazole ring, an imidazole ring, a benzimidazole ring, a triazole ring, a thiazole ring, an oxazole ring, a pyrrolidone ring, and a morpholine ring. In particular, a thiophene ring, a furan ring, or a dibenzofuran ring is preferable.

n and m represent a natural number of 100 or less, preferably 1 to 12, more preferably 1 to 6, and still more preferably 1 to 3.

In Formula (1), $R^4$ and $R^5$ each independently represent a hydrogen atom or a monovalent organic group. The monovalent organic group is preferably an organic group having 1 to 40 carbon atoms, more preferably an organic group having 3 to 35 carbon atoms, and more preferably an organic group having 5 to 30 carbon atoms and may have 8 to 20 carbon atoms. It is preferable that $R^4$ and $R^5$ have a radically polymerizable group, and it is preferable that $R^4$ and $R^5$ have the same radically polymerizable group as the radically polymerizable group included in the radically polymerizable compound other than the compound represented by Formula (1) described below. It is preferable that at least one of $R^4$ or $R^5$ has an organic group represented by $R^3$ in Formula (1). In addition, it is more preferable that at least one of $R^4$ or $R^5$ has the same organic group as the organic group included in the other radically polymerizable compound. Examples of the radically polymerizable group include a vinylphenyl group, a vinyl group, a (meth)acryloyl group, and a group having an ethylenically unsaturated bond such as an allyl group. As the radically polymerizable group, a (meth)acryloyl group is preferable.

Regarding $R^4$ or $R^5$ in Formula (1), (i) an aspect where both $R^4$ and $R^5$ represent a hydrogen atom or (ii) an aspect where one of $R^4$ or $R^5$ represents a hydrogen atom or another one of $R^4$ or $R^5$ represents an organic group represented by the following Formula (1-3) is preferable, and (ii) an aspect where one of $R^4$ or $R^5$ represents a hydrogen atom or another one of $R^4$ or $R^5$ represents an organic group represented by the following Formula (1-3) is more preferable. By adopting the aspect where $R^4$ or $R^5$ represents an organic group represented by Formula (1-3), the effects of the present invention tend to be more effectively exhibited.

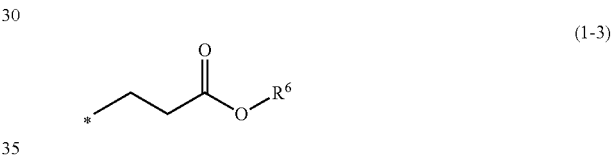

(1-3)

In the formula, $R^6$ represents a monovalent organic group and preferably a group having the same definition as that of $R^3$. A preferable range of $R^6$ is the same as that of $R^3$. * represents a binding site.

Examples of another preferable embodiment of $R^3$ include a group represented by the following formula.

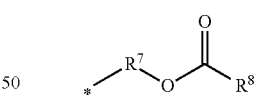

In the following formula, $R^7$ represents a divalent organic group and $R^8$ represents an alkyl group.

$R^7$ has the same definition and the same preferable range as that in Formula (1-1).

$R^8$ may have the substituent T within a range where the effects of the present invention do not deteriorate. Examples of this substituent include an amino group (for example, having preferably 0 to 12 carbon atoms, more preferably 0 to 6 carbon atoms, and still more preferably 0 to 3 carbon atoms).

It is more preferable that the compound represented by Formula (1) is represented by the following Formula (1-4).

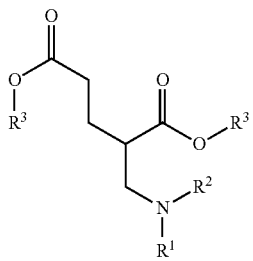

(1-4)

In Formula (1-4), $R^1$ to $R^3$ each independently have the same definitions and the same preferable ranges as those of $R^1$ to $R^3$ in Formula (1). In Formula (1-4), two $R^3$'s may be the same as or different from each other and are preferably the same as each other.

The molecular weight of the compound represented by Formula (1) is preferably 100 to 1500, more preferably 150 to 1300, still more preferably 200 to 1000, and still more preferably 200 to 700. With a small amount of addition in the above-described range, the effect of improving adhesive strength is more effectively exhibited.

In addition, the compound represented by Formula (1) does not necessarily have a radically polymerizable group. However, it is preferable that the compound represented by Formula (1) has a radically polymerizable group, it is more preferable that at least one of $R^3$, $R^4$, or $R^5$ represents a radically polymerizable group, and it is still more preferable that one of $R^3$, $R^4$, or $R^5$ represents a radically polymerizable group.

Two selected from R3 to R5 may be bonded to each other to form a ring. In the formed ring, any linking group may be present, and examples of the linking group include the examples of the linking group L.

It is preferable that the compound represented by Formula (1) consists of only atoms selected from a carbon atom, an oxygen atom, a hydrogen atom, and a nitrogen atom.

Specific examples of the compound represented by Formula (1) include the following compounds.

Compound G-1

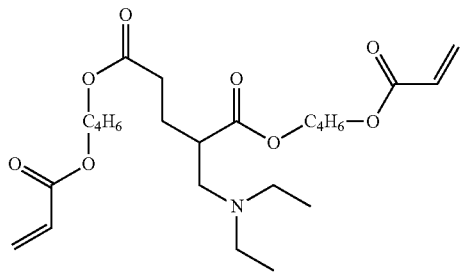

Compound G-2

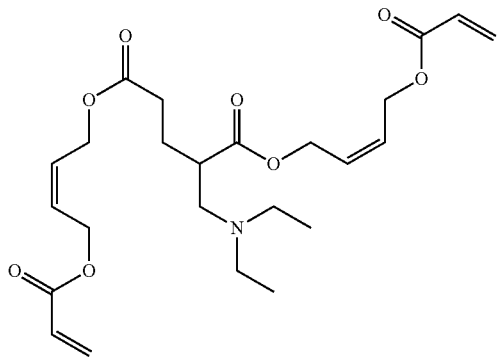

Compound G-3

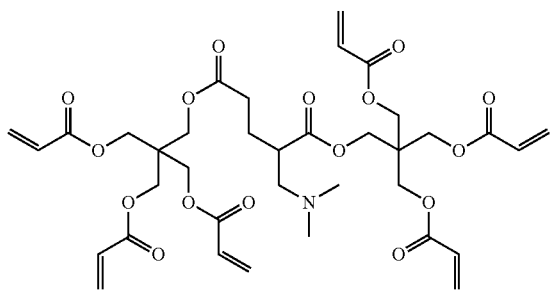

Compound G-4

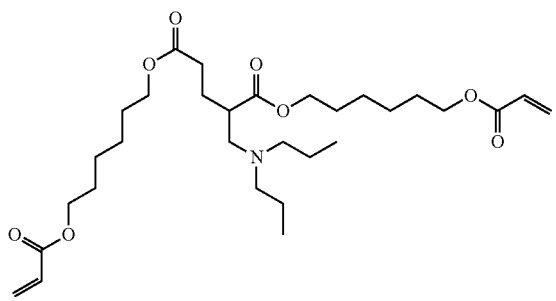

Compound G-5

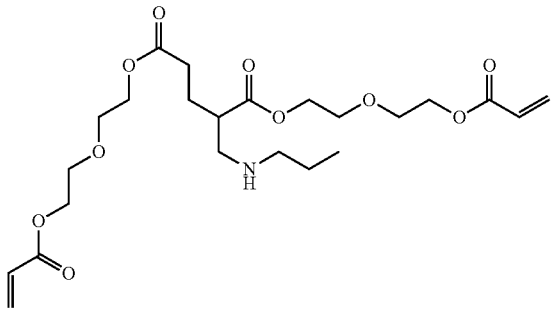

Compound G-6

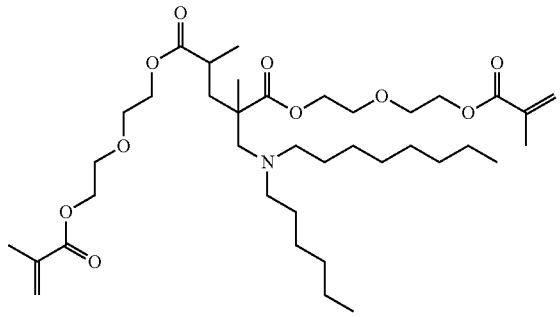

-continued
Compound G-7
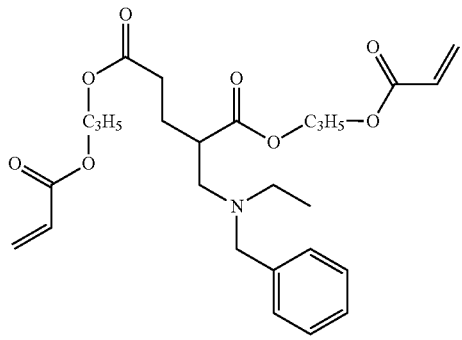
Compound G-8
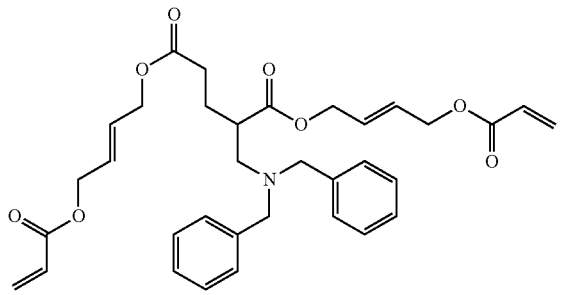
Compound G-9
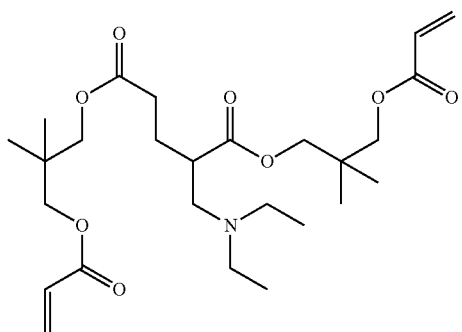
Compound G-10
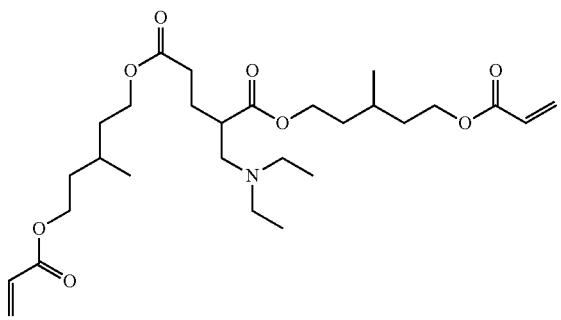
Compound G-11
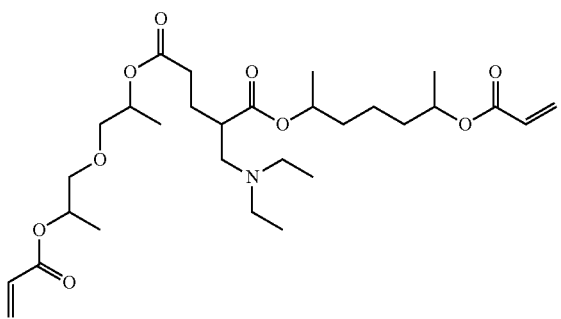
Compound G-12
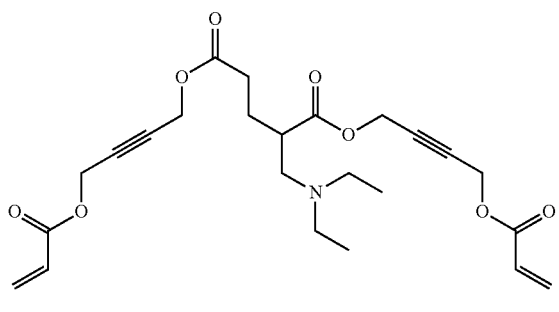
Compound G-13
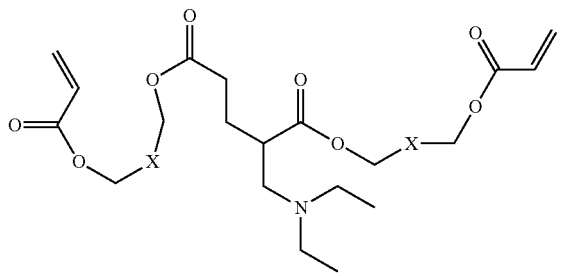
Compound G-14
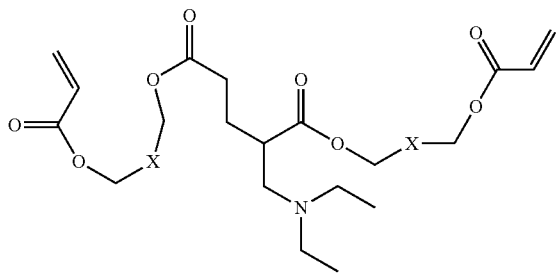
X = Linked through A-B or B-A
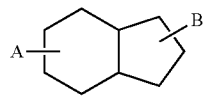
X = Linked through A-B or B-A
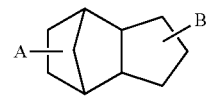

-continued
Compound G-15
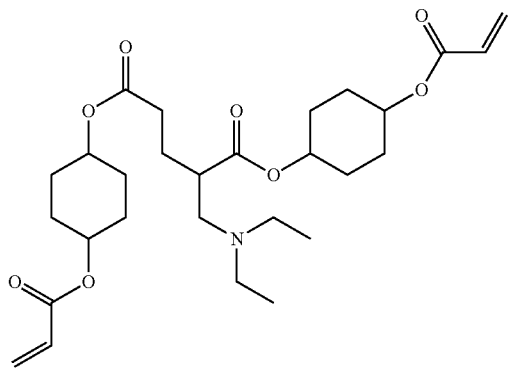
Compound G-16
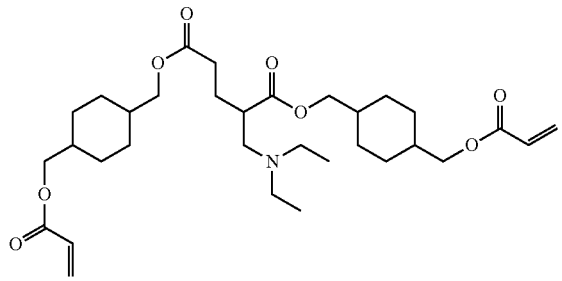
Compound G-17
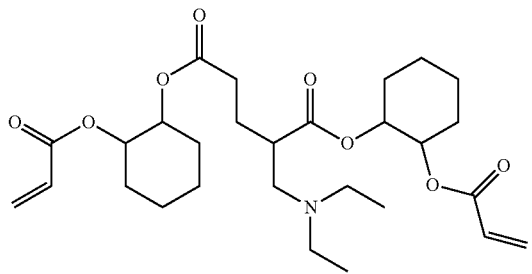
Compound G-18
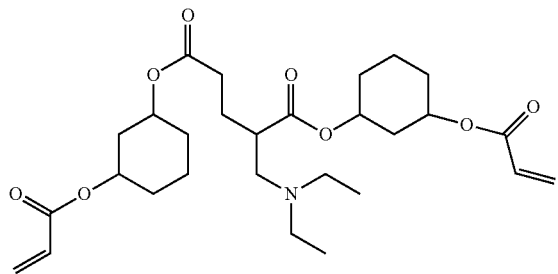
Compound G-19
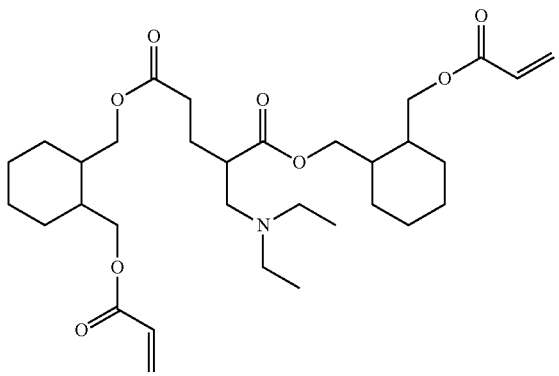
Compound G-20
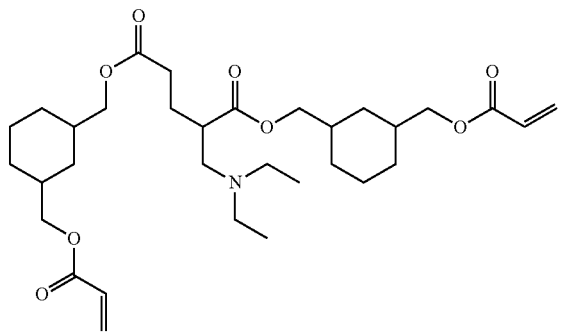
Compound G-21
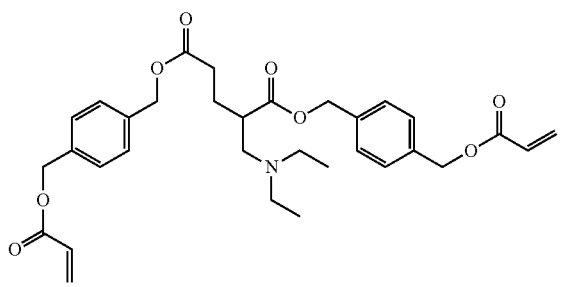
Compound G-22
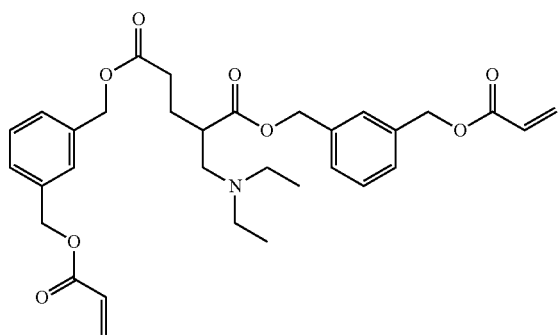

Compound G-23
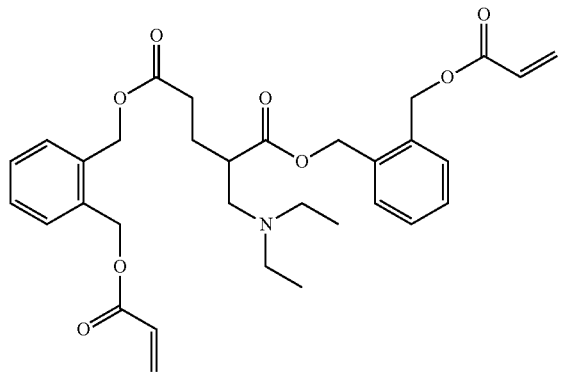
Compound G-24
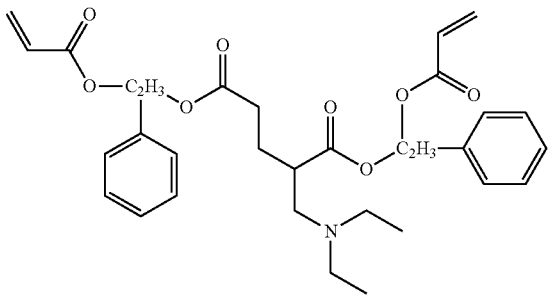
Compound G-25
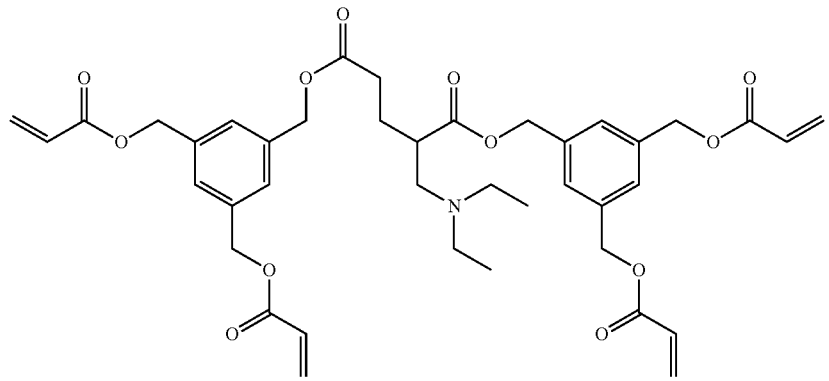
Compound G-26
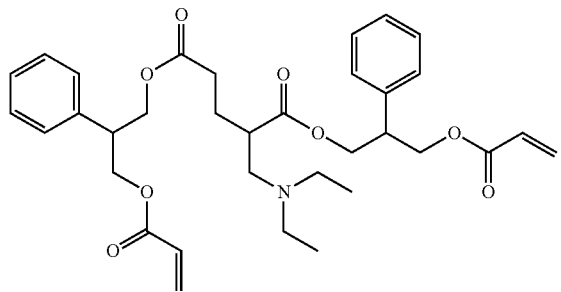
Compound G-27
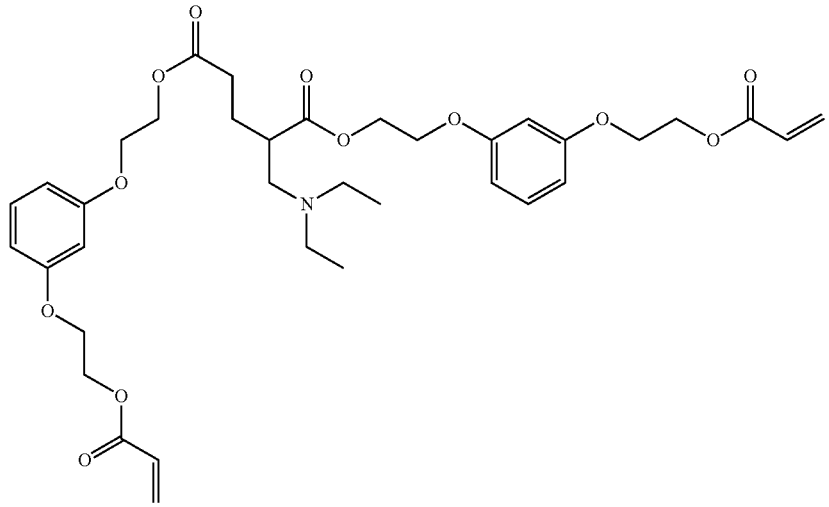

Compound G-28
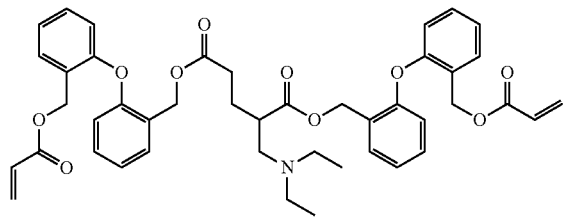
Compound G-29
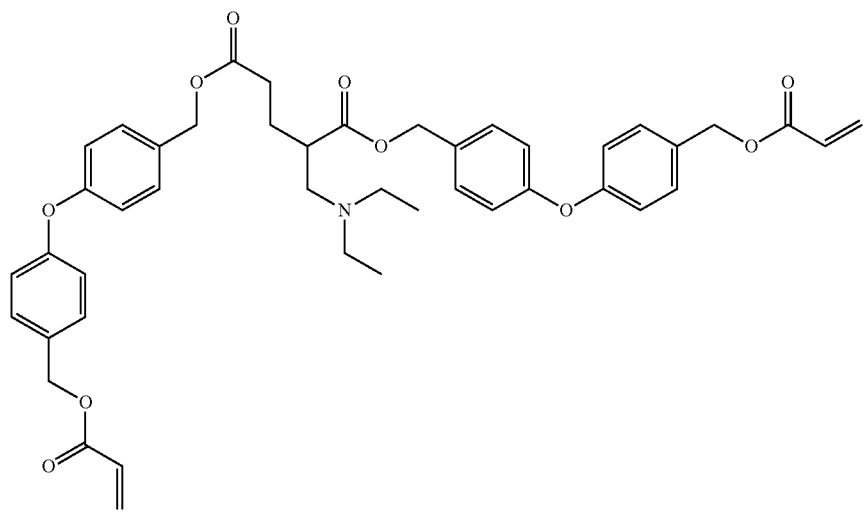
Compound G-30
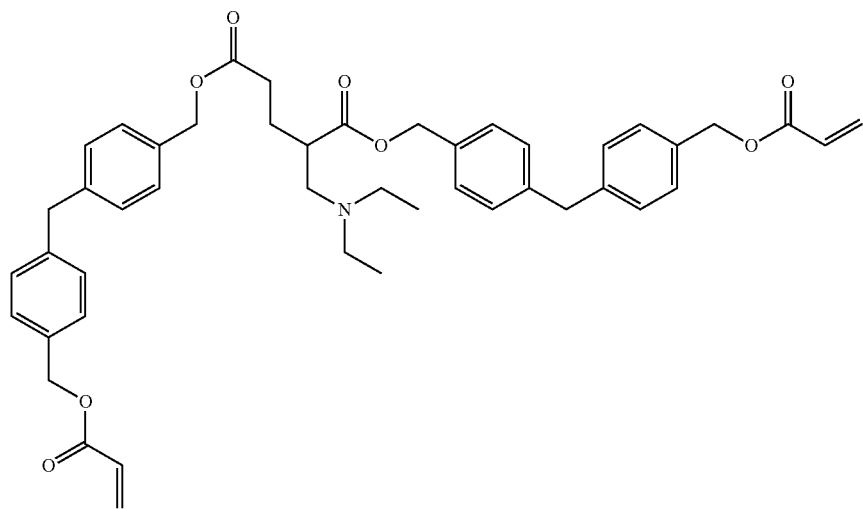

Compound G-31
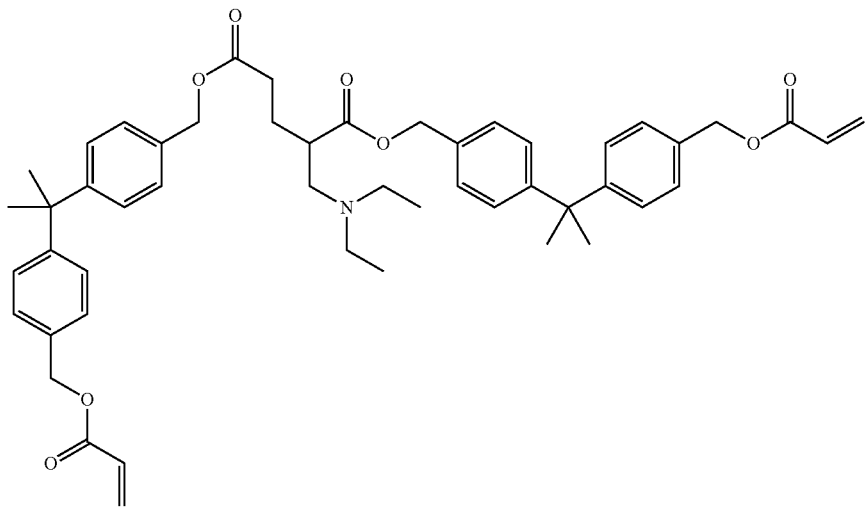
Compound G-32
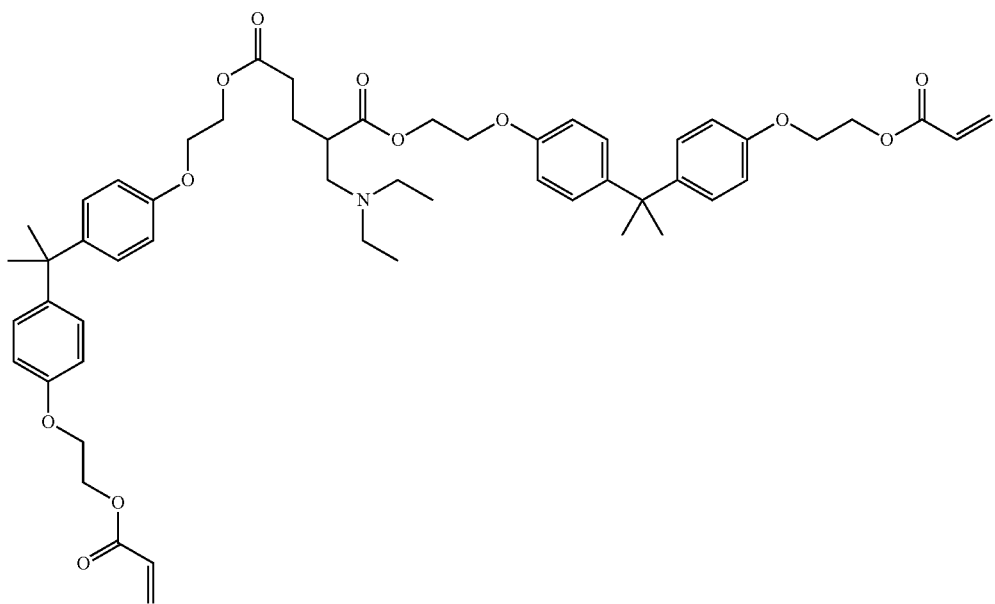
Compound G-33
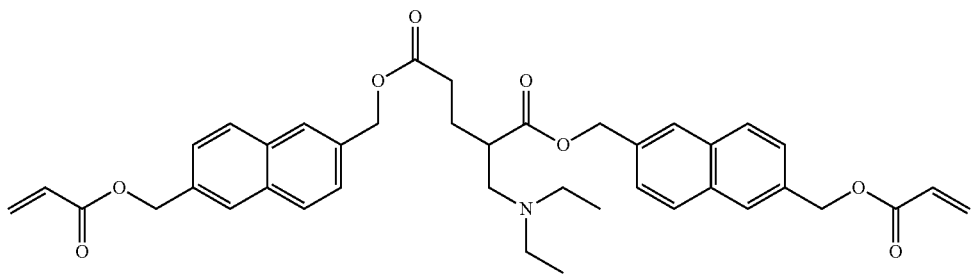

-continued
Compound G-34
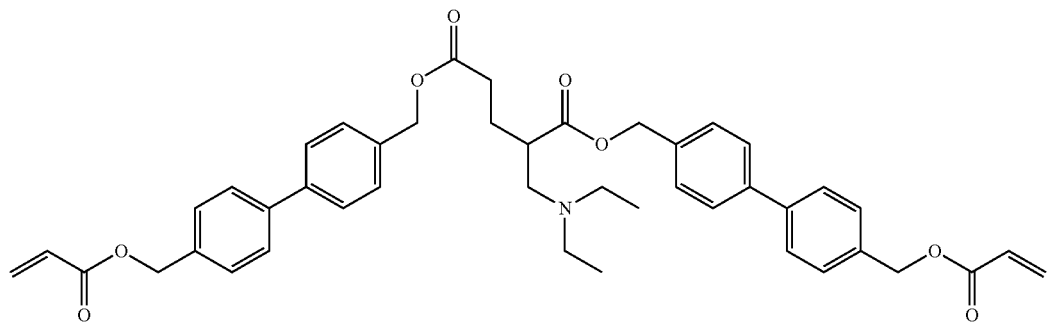
Compound G-35
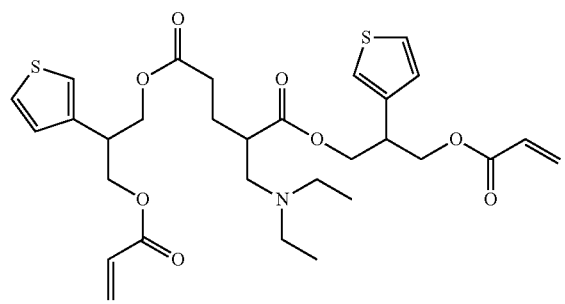
Compound G-36
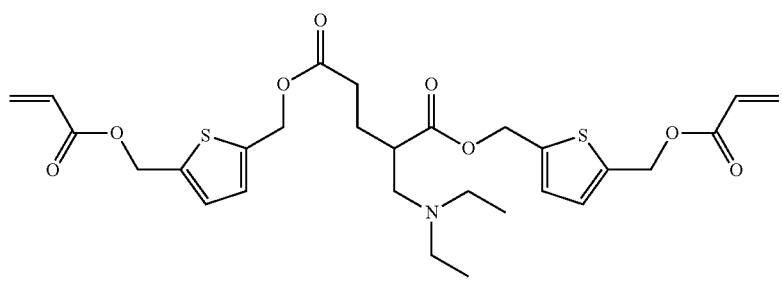
Compound G-37
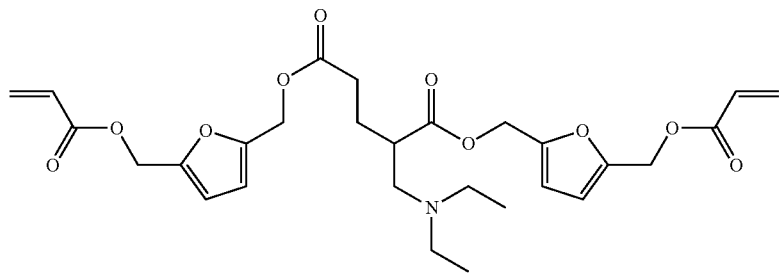

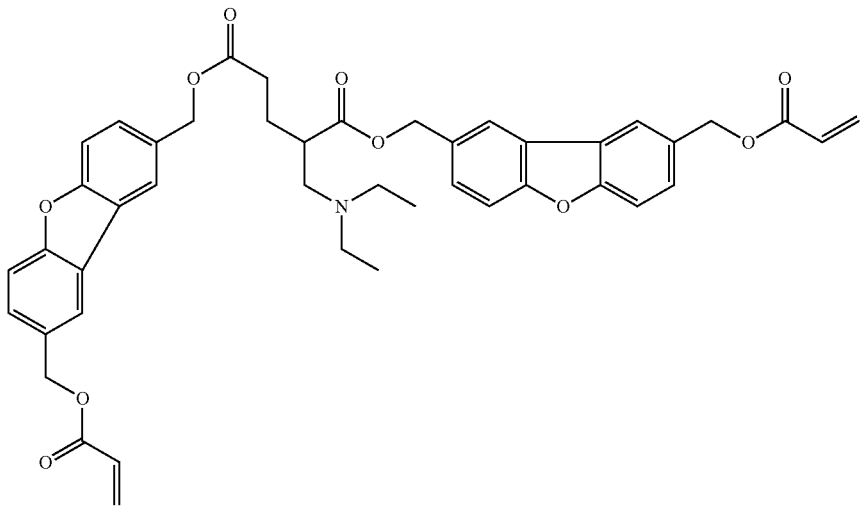

Compound G-38

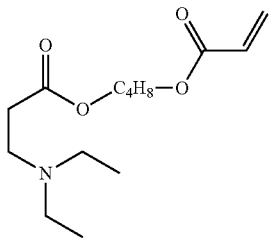

Compound G-39

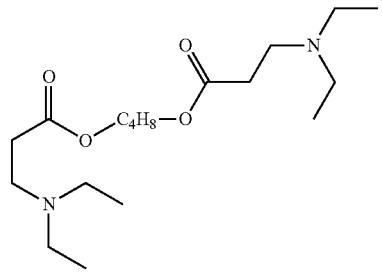

Compound G-40

The content of the compound represented by Formula (1) in the curable composition for imprinting according to the embodiment of the present invention is preferably 0.005 to 1 part by mass, more preferably 0.01 to 0.75 parts by mass, and still more preferably 0.05 to 0.5 parts by mass with respect to 100 parts by mass of the radically polymerizable compound other than the compound represented by Formula (1). Within the above-described range, adhesiveness, releasing force, and temporal stability are excellent with a good balance.

The curable composition for imprinting according to the embodiment of the present invention may be configured by using the compound represented by Formula (1) and a compound represented by Formula (2) described below optionally in combination with other components. The content of the compound represented by Formula (1) in the curable composition for imprinting according to the embodiment of the present invention is preferably 0.005 to 1 part by mass, more preferably 0.01 to 0.75 parts by mass, and still more preferably 0.05 to 0.5 parts by mass with respect to 100 parts by mass of the compound represented by Formula (2) described below. Within the above-described range, adhesiveness, releasing force, and temporal stability are excellent with a good balance.

In addition, the content of the compound represented by Formula (1) in the curable composition for imprinting according to the embodiment of the present invention is preferably 0.005 to 1 mass %, more preferably 0.01 to 0.75 mass %, and still more preferably 0.05 to 0.5 mass % with respect to the total solid content of the curable composition for imprinting.

By adjusting the above-described content (the addition amount of the compound represented by Formula (1)) to be the above-described upper limit value or less, excellent releasability can be maintained, which is preferable. By adjusting the above-described content (the addition amount of the compound represented by Formula (1)) to be the above-described lower limit value or more, the adhesiveness and the stability can be more effectively exhibited, which is preferable.

The curable composition for imprinting according to the embodiment of the present invention may include one compound represented by Formula (1) or two or more compounds represented by Formula (1). In a case where the curable composition for imprinting according to the embodiment of the present invention includes two or more compounds represented by Formula (1), it is preferable that the total content of the two or more compounds represented by Formula (1) is in the above-described range.

<Radically Polymerizable Compound Other than Compound Represented by Formula (1)>

The curable composition for imprinting according to the embodiment of the present invention includes the radically polymerizable compound other than the compound represented by Formula (1) (other radically polymerizable compound). It is preferable that the other radically polymerizable compound does not have an aminomethyl group.

The other radically polymerizable compound may be a monofunctional radically polymerizable compound having one radically polymerizable group or a polyfunctional radically polymerizable compound having two or more radically polymerizable groups. It is preferable that the curable composition for imprinting according to the embodiment of the present invention includes the polyfunctional radically polymerizable compound, and it is more preferable that the curable composition for imprinting according to the embodiment of the present invention includes both the polyfunctional radically polymerizable compound and the monofunctional radically polymerizable compound.

It is preferable that the polyfunctional radically polymerizable compound includes at least one of a difunctional radically polymerizable compound or a trifunctional radically polymerizable compound, and it is preferable that the polyfunctional radically polymerizable compound includes at least one difunctional radically polymerizable compound.

Examples of the radically polymerizable group included in the other radically polymerizable compound include a vinylphenyl group, a vinyl group, a (meth)acryloyl group, and a group having an ethylenically unsaturated bond such as an allyl group. As the radically polymerizable group, a (meth)acryloyl group is preferable, and an acryloyl group is more preferable.

The content of the other radically polymerizable compound in the curable composition for imprinting according to the embodiment of the present invention is preferably 40 to 99.9 mass %, more preferably 60 to 99 mass %, and still more preferably 75 to 98 mass %.

The curable composition for imprinting according to the embodiment of the present invention may include one other radically polymerizable compound or two or more other radically polymerizable compounds. In a case where the composition includes two or more other radically polymerizable compounds, it is preferable that the total content of the two or more other radically polymerizable compounds is in the above-described range.

<<Polyfunctional Radically Polymerizable Compound>>

In the present invention, it is preferable that the radically polymerizable compound other than the compound represented by Formula (1) includes a compound represented by the following Formula (2). Within the above-described range, adhesiveness, releasing force, and temporal stability are excellent with a good balance.

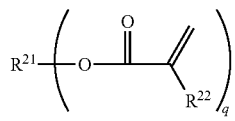
(2)

In the following formula, $R^{21}$ represents a q-valent organic group, $R^{22}$ represents a hydrogen atom or a methyl group, and q represents an integer of 2 or more. q represents preferably an integer of 2 to 7, more preferably an integer of 2 to 4, still more preferably 2 or 3, and still more preferably 2.

$R^{21}$ represents preferably a divalent to heptavalent organic group, more preferably a divalent to tetravalent organic group, still more preferably a divalent or trivalent organic group, and still more preferably a divalent organic group. It is preferable that $R^{21}$ represents a hydrocarbon group having at least one linear, branched, or cyclic structure. The number of carbon atoms in the hydrocarbon group is preferably 2 to 20 and more preferably 2 to 10.

In a case where $R^{21}$ represents a divalent organic group, the divalent organic group is preferably the linking group represented by Formula (1-2), and a preferable range is also the same. In a preferable aspect of the present invention, the structure represented by Formula (1-2) in Formula (1) and the structure represented by Formula (1-2) in Formula (2) match each other in the composition.

In a case where $R^{21}$ has a ring structure, it is also preferable that the ring structure is a structure including an alicyclic ring or an aromatic ring described below regarding "(3) Alicyclic Ring or Aromatic Ring Substituted with Linear or Branched Alkyl Group having 5 or more Carbon Atoms".

It is preferable that the polyfunctional radically polymerizable compound is represented by the following Formula (2-1).

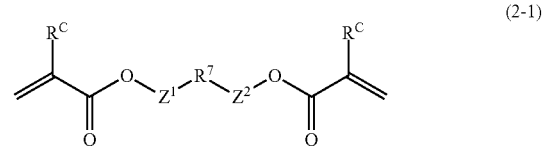
(2-1)

In Formula (2-1), $R^7$ and $R^C$ have the same definitions as those described regarding Formula (1-1).

The curable composition for imprinting according to the embodiment of the present invention may include one polyfunctional radically polymerizable compound or two or more polyfunctional radically polymerizable compounds.

An Ohnishi parameter of the polyfunctional radically polymerizable compound used in the present invention is preferably 4.5 or lower. The lower limit value of the Ohnishi parameter is not particularly limited and is, for example, 2.0 or higher.

The molecular weight of the polyfunctional radically polymerizable compound used in the present invention is preferably 1000 or lower, more preferably 800 or lower, still more preferably 500 or lower, still more preferably 350 or lower, and still more preferably 230 or lower. By adjusting the upper limit value of the molecular weight to be the above-described upper limit value or lower, the viscosity of the compound can be reduced.

The lower limit value of the molecular weight is not particularly limited and is, for example, 170 or higher.

The number of polymerizable groups in the polyfunctional radically polymerizable compound used in the present invention is 2 or more, preferably 2 to 7, more preferably 2 to 4, still more preferably 2 or 3, and still more preferably 2.

The kind of atoms constituting the polyfunctional radically polymerizable compound used in the present invention is not particularly limited, it is preferable that the bifunctional polymerizable compound consists of only atoms selected from the group consisting of a carbon atom, an oxygen atom, a hydrogen atom, and a halogen atom, and it is more preferable that the bifunctional polymerizable compound consists of only atoms selected from the group consisting of a carbon atom, an oxygen atom, and a hydrogen atom.

The viscosity of the polyfunctional radically polymerizable compound used in the present invention at 25° C. is preferably 180 mPa·s or lower, more preferably 10 mPa·s or lower, still more preferably 7 mPa·s or lower, and still more preferably 5 mPa·s or lower. The lower limit value of the viscosity is not particularly limited and is, for example, 2 mPa·s or higher.

Examples of the polyfunctional radically polymerizable compound which is preferably used in the present invention include a polymerizable compound described in JP2014-170949A, the contents of which are incorporated herein by reference.

Specific examples of the compound represented by Formula (2) include the following compounds.
Compound B-1
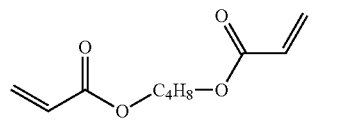
Compound B-2
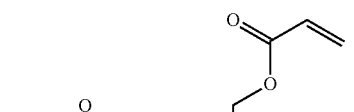
Compound B-3
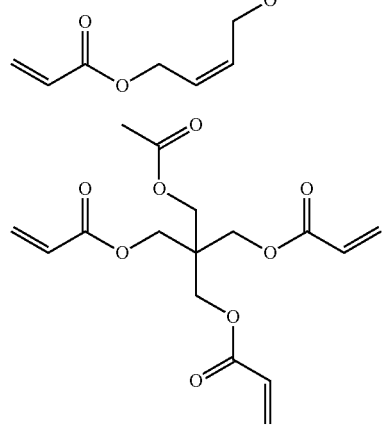
Compound B-4
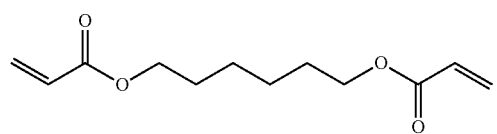
Compound B-5
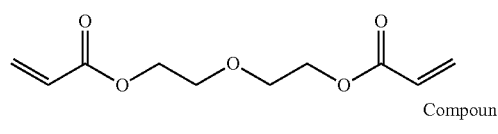
Compound B-6
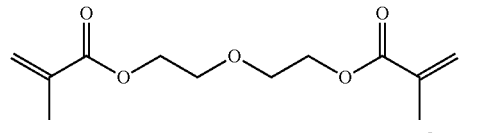
Compound B-7
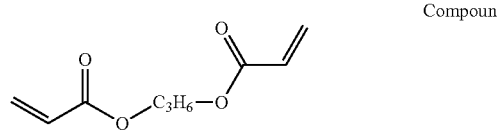
Compound B-8
Compound B-9
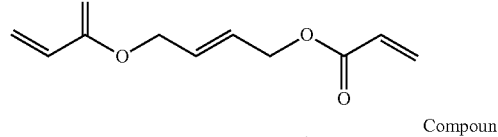
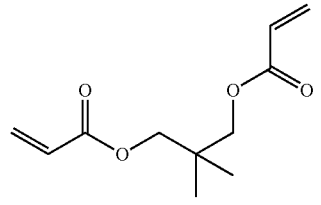
Compound B-10
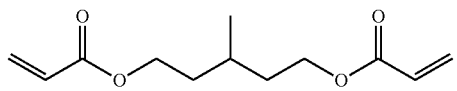
Compound B-11
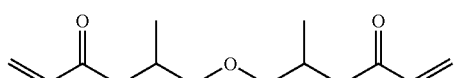
Compound B-12
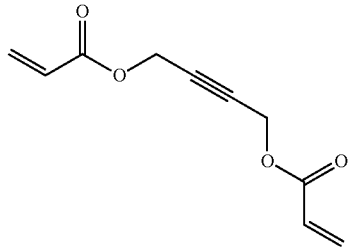
Compound B-13
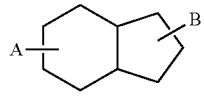
X = Linked through A-B or B-A
Compound B-14
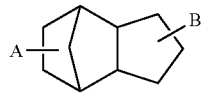
X = Linked through A-B or B-A
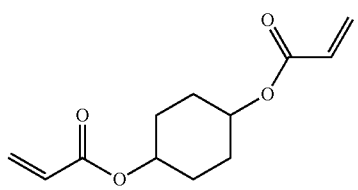
Compound B-16
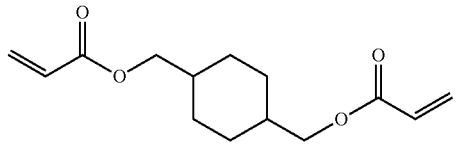
Compound B-16
(duplicate labeling in source)
Compound B-17
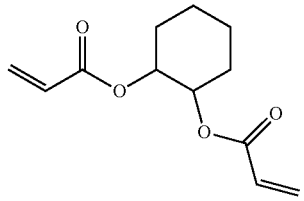

Compound B-18
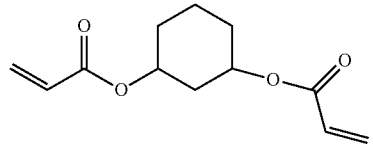
Compound B-19
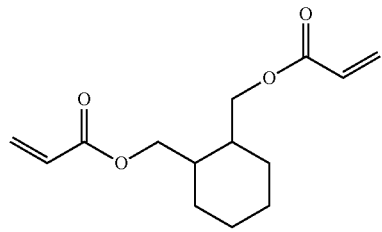
Compound B-20
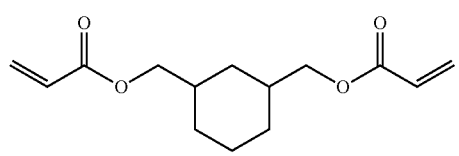
Compound B-21
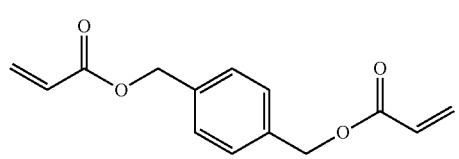
Compound B-22
Compound B-23
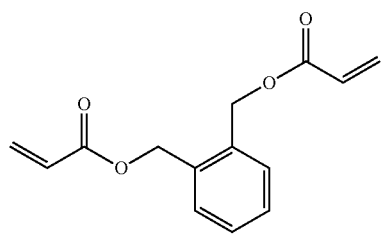
Compound B-24
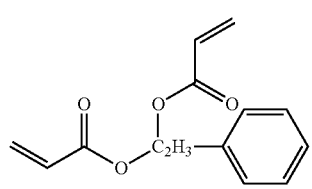
Compound B-25
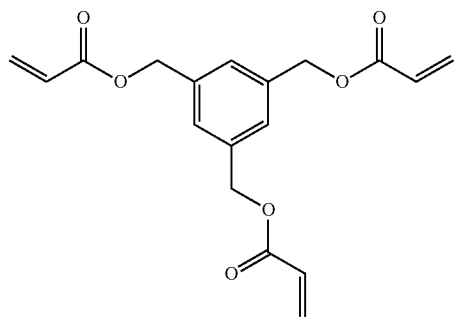
Compound B-26
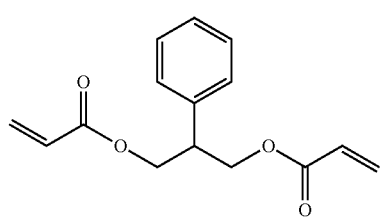
Compound B-27
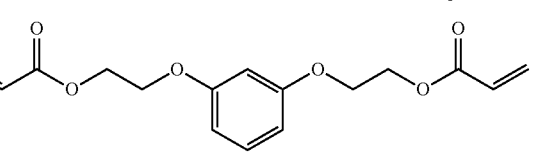
Compound B-28
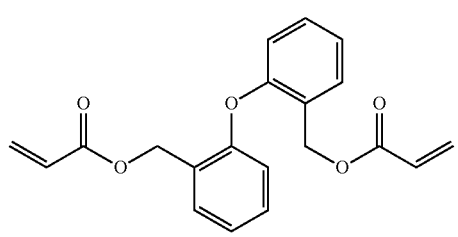
Compound B-29
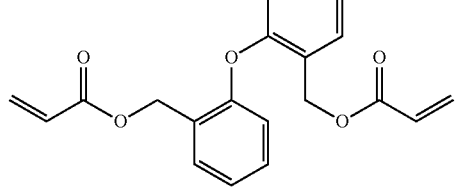
Compound B-30
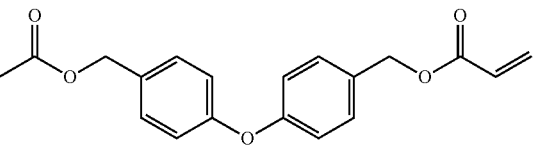
Compound B-31
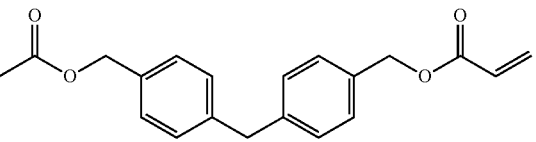

Compound B-32
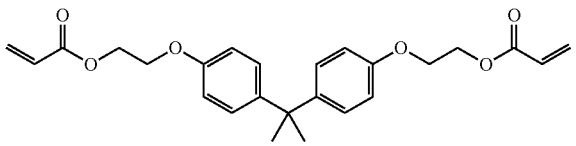

Compound B-33
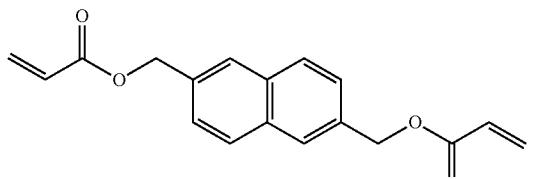

Compound B-34
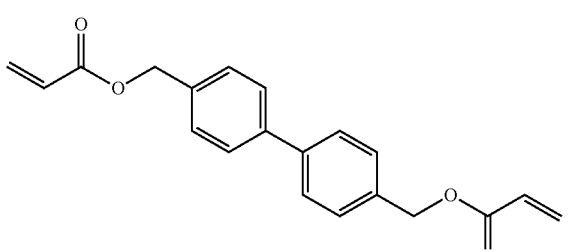

Compound B-35
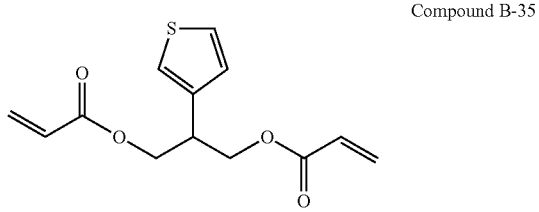

Compound B-36
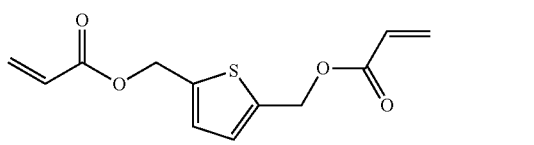

Compound B-37
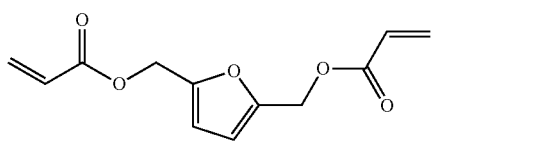

Compound B-38
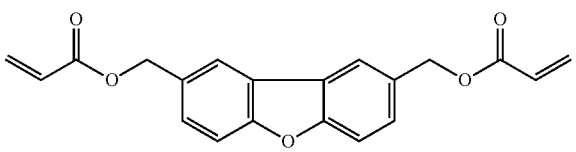

The content of the polyfunctional radically polymerizable compound used in the present invention is preferably 30 to 99 mass %, more preferably 50 to 95 mass %, still more preferably 75 to 90 mass %, and still more preferably 80 to 90 mass % with respect to the total amount of all the radically polymerizable compounds in the curable composition for imprinting.

The curable composition for imprinting according to the embodiment of the present invention may include one polyfunctional radically polymerizable compound or two or more polyfunctional radically polymerizable compounds. In a case where the composition includes two or more polyfunctional radically polymerizable compounds, it is preferable that the total content of the two or more polyfunctional radically polymerizable compounds is in the above-described range.

As a method of manufacturing the polyfunctional radically polymerizable compound, an ordinary method may be used. For some exemplary compounds, a synthesis method or an available manufacturer will be described as an example. B-22 can be synthesized from α,α'-dichloro-m-xylene and acrylic acid. B-16 can be synthesized from 1,4-cyclohexanedimethanol and acryloylchloride. As B-14, A-DCP (trade name, manufactured by Shin-Nakamura Chemical Co., Ltd.) can be used. As B-32, LIGHT ACRYLATE BP-4PA (trade name, manufactured by Kyoeisha Chemical Co., Ltd.) can be used. As B-9, A-NPG (trade name, manufactured by Shin-Nakamura Chemical Co., Ltd.) can be used. As B-3, A-HD-N (trade name, manufactured by Shin-Nakamura Chemical Co., Ltd.) can be used. As B-6, LIGHT ESTER 2EG (trade name, manufactured by Kyoeisha Chemical Co., Ltd.) can be used. B-2 can be synthesized from cis-2-butene-1,4-diol and acryloylchloride. As B-10, SR341 (trade name, manufactured by Sartomer) can be used.

<Monofunctional Radically Polymerizable Compound>

The kind of the monofunctional radically polymerizable compound used in the present invention is not particularly limited within a range not departing from the scope of the present invention. It is preferable that the monofunctional radically polymerizable compound used in the present invention has a linear or branched hydrocarbon chain having 4 or more carbon atoms. The curable composition for imprinting according to the embodiment of the present invention may include one monofunctional radically polymerizable compound or two or more monofunctional radically polymerizable compounds.

The Ohnishi parameter of the monofunctional radically polymerizable compound used in the present invention is preferably 8.1 or lower, more preferably 4.0 or lower, still more preferably 3.9 or lower, still more preferably 3.7 or lower, and even yet still more preferably 3.5 or lower. The lower limit value of the Ohnishi parameter is not particularly limited and is, for example, 2.0 or higher and preferably 2.5 or higher. In a case where the Ohnishi parameter is 4.0 or lower, the etching rate can be reduced, an etching selection ratio with respect to an object to be processed is improved, and an etching margin can be widened.

Here, the Ohnishi parameter is a value calculated from the following expression.

Ohnishi Parameter=(Sum of Numbers of C, H, and O Atoms)/(Number of C Atoms−Number of O Atoms)

The molecular weight of the monofunctional radically polymerizable compound used in the present invention is preferably 50 or higher, more preferably 150 or higher, and still more preferably 220 or higher.

The upper limit value of the molecular weight is preferably 1000 or lower, more preferably 800 or lower, still more preferably 300 or lower, and still more preferably 270 or lower. By adjusting the molecular weight to be the above-described lower limit value or higher, volatility can be suppressed. By adjusting the molecular weight to be the above-described upper limit value or higher, viscosity can be reduced.

A boiling point of the monofunctional radically polymerizable compound used in the present invention at 1013 hPa is not particularly limited and may be, for example, lower than 60° C. or 60° C. or higher. In one embodiment, the boiling point is 80° C. or higher. By adjusting the boiling point at 667 Pa to be the above-described lower limit value or higher, volatility can be suppressed. The upper limit value of the boiling point is not particularly limited. For example, the boiling point at 667 Pa is 170° C. or lower.

It is preferable that the monofunctional radically polymerizable compound used in the present invention is liquid at 25° C.

In the present invention, the compound that is liquid at 25° C. refers to a compound having fluidity at 25° C., for example, a compound having a viscosity of 1 to 100,000 mPa·s at 25° C. The viscosity of the monofunctional radically polymerizable compound at 25° C. is, for example, more preferably 10 to 20,000 mPa·s and still more preferably 100 to 15,000 mPa·s.

By using the compound that is liquid at 25° C., the curable composition for imprinting may not substantially include a solvent. Here, substantially not including a solvent represents that, for example, the content of the solvent is preferably 5 mass % or lower, more preferably 3 mass %, and still more preferably 1 mass % or lower with respect to the curable composition for imprinting according to the embodiment of the present invention.

The viscosity of the monofunctional radically polymerizable compound used in the present invention at 25° C. is preferably 100 mPa·s or lower, more preferably 10 mPa·s or lower, still more preferably 8 mPa·s or lower, and still more preferably 6 mPa·s or lower. By adjusting the viscosity of the monofunctional radically polymerizable compound at 25° C. to be the above-described upper limit value or lower, the viscosity of the curable composition for imprinting can be reduced, and filling properties tend to be improved. The lower limit value is not particularly limited and is, for example, 1 mPa·s or higher.

The monofunctional radically polymerizable compound used in the present invention is preferably a monofunctional (meth)acrylic monomer and more preferably a monofunctional acrylate.

The kind of atoms constituting the monofunctional radically polymerizable compound used in the present invention is not particularly limited, it is preferable that the bifunctional polymerizable compound consists of only atoms selected from the group consisting of a carbon atom, an oxygen atom, a hydrogen atom, and a halogen atom, and it is more preferable that the bifunctional polymerizable compound consists of only atoms selected from the group consisting of a carbon atom, an oxygen atom, and a hydrogen atom.

It is preferable that the monofunctional radically polymerizable compound used in the present invention has a linear or branched hydrocarbon chain having 4 or more carbon atoms. The hydrocarbon chain in the present invention refers to an alkyl chain, an alkenyl chain, or an alkynyl chain. Among these, an alkyl chain or an alkenyl chain is preferable, and an alkyl chain is more preferable.

In the present invention, the alkyl chain refers to an alkyl group or an alkylene group. Likewise, the alkenyl chain refers to an alkenyl group or an alkenylene group, and the alkynyl chain refers to an alkynyl group or an alkynylene group. Among these, a linear or branched alkyl group or an alkenyl group is more preferable, a linear or branched alkyl group is still more preferable, and a linear alkyl group is still more preferable.

The linear or branched hydrocarbon chain (preferably an alkyl group) has preferably 4 or more carbon atoms, more preferably 6 or more carbon atoms, still more preferably 8 or more carbon atoms, still more preferably 10 or more carbon atoms, and still more preferably 12 or more carbon atoms. The upper limit value of the number of carbon atoms is not particularly limited and is, for example, 25 or less.

The linear or branched hydrocarbon chain may include an ether group (—O—). However, it is preferable that the linear or branched hydrocarbon chain does not include an ether group from the viewpoint of improving the releasability.

By using the monofunctional radically polymerizable compound having the hydrocarbon chain, the modulus of elasticity of the cured film can be reduced and the releasability can be improved with a relatively small addition amount. In addition, by using the monofunctional radically polymerizable compound having the linear or branched alkyl group, the interfacial energy between a mold and the cured film can be reduced, and the releasability can be further improved.

Preferable examples of the hydrocarbon group included in the monofunctional radically polymerizable compound used in the present invention include (1) to (3).

(1) a linear alkyl group having 8 or more carbon atoms (2) a branched alkyl group having 10 or more carbon atoms.

(3) an alicyclic ring or an aromatic ring substituted with a linear or branched alkyl group having 5 or more Carbon atoms <<<(1) Linear Alkyl Group having 8 or more Carbon Atoms>>>

The linear alkyl group having 8 or more carbon atoms has more preferably 10 or more carbon atoms, still more preferably 11 or more carbon atoms, and still more preferably 12 or more carbon atoms. The linear alkyl group having 8 or more carbon atoms has preferably 20 or less carbon atoms, more preferably 18 or less carbon atoms, still more preferably 16 or less carbon atoms, and still more preferably 14 or less carbon atoms.

<<<(2) Branched Alkyl Group having 10 or more Carbon Atoms>>>

The branched alkyl group having 10 or more carbon atoms has preferably 10 to 20 carbon atoms, more preferably 10 to 16 carbon atoms, still more preferably 10 to 14 carbon atoms, and still more preferably 10 to 12 carbon atoms.

<<<(3) Alicyclic Ring or Aromatic Ring Substituted with Linear or Branched Alkyl Group Having 5 or More Carbon Atoms>>>

The linear or branched alkyl group having 5 or more carbon atoms is more preferably a linear alkyl group. The number of carbon atoms in the alkyl group is more preferably 6 or more, still more preferably 7 or more, and still more preferably 8 or more. The number of carbon atoms in the alkyl group is preferably 14 or less, more preferably 12 or less, and still more preferably 10 or less.

The ring structure of the alicyclic ring or the aromatic ring may be a monocycle or a fused ring and is preferably a monocycle. In a case where the ring structure is a fused ring, the number of rings is preferably 2 or 3. As the ring structure, a 3- to 8-membered ring is preferable, a 5- or 6-membered ring is more preferable, and a 6-membered ring is still more preferable. In addition, the ring structure is an alicyclic ring or an aromatic ring and is preferably an aromatic ring. Specific examples of the ring structure include a cyclohexane ring, a norbornane ring, a isobornane ring, a tricyclodecane ring, a tetracyclododecane ring, an adamantane ring, a benzene ring, a naphthalene ring, an anthracene ring, and a fluorene ring. Among these, a cyclohexane ring, a tricyclodecane ring, or an adamantane ring, a benzene ring is more preferable, and a benzene ring is still more preferable.

As the monofunctional radically polymerizable compound used in the present invention, a compound in which a linear or branched hydrocarbon chain having 4 or more carbon atoms and a polymerizable group are bonded to each other directly or through a linking group is preferable, and a compound in which one group selected from the groups (1) to (3) and a polymerizable group are bonded to each other directly is more preferable. Examples of the linking group include —O—, —C(=O)—, —CH$_2$—, and a combination thereof. As the monofunctional radically polymerizable compound used in the present invention, (1) a linear alkyl (meth)acrylate in which the linear alkyl group having 8 or more carbon atoms and a (meth)acryloyloxy group are directly bonded to each other is more preferable.

Examples of the monofunctional radically polymerizable compound which is preferably used in the present invention include the following first group, the following second group, and compounds used in Examples other than the first and second groups. However, it is needless to say that the present invention is not limited to these examples. In addition, the first group is preferable to the second group.

First Group

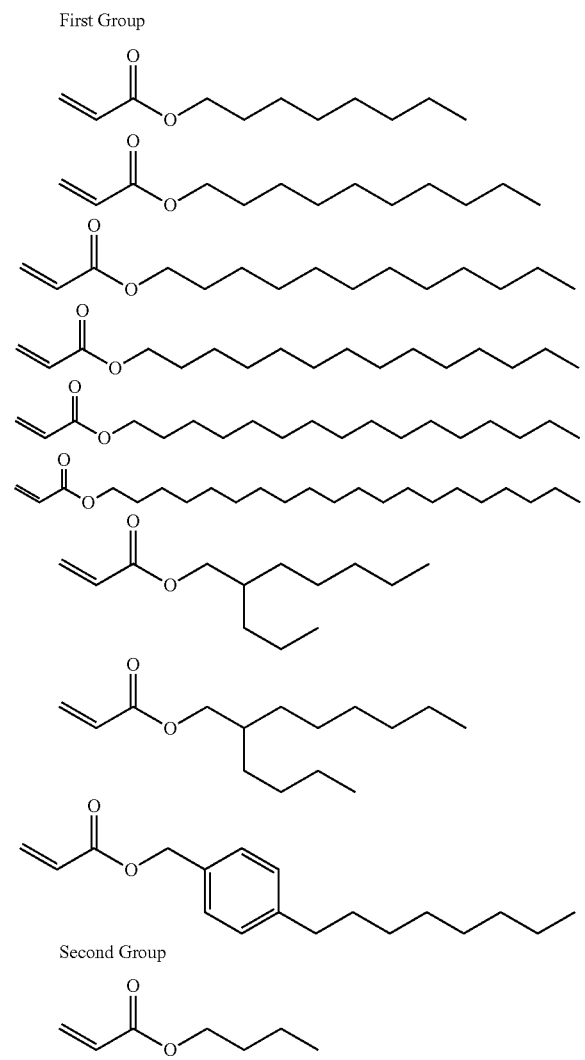

Second Group

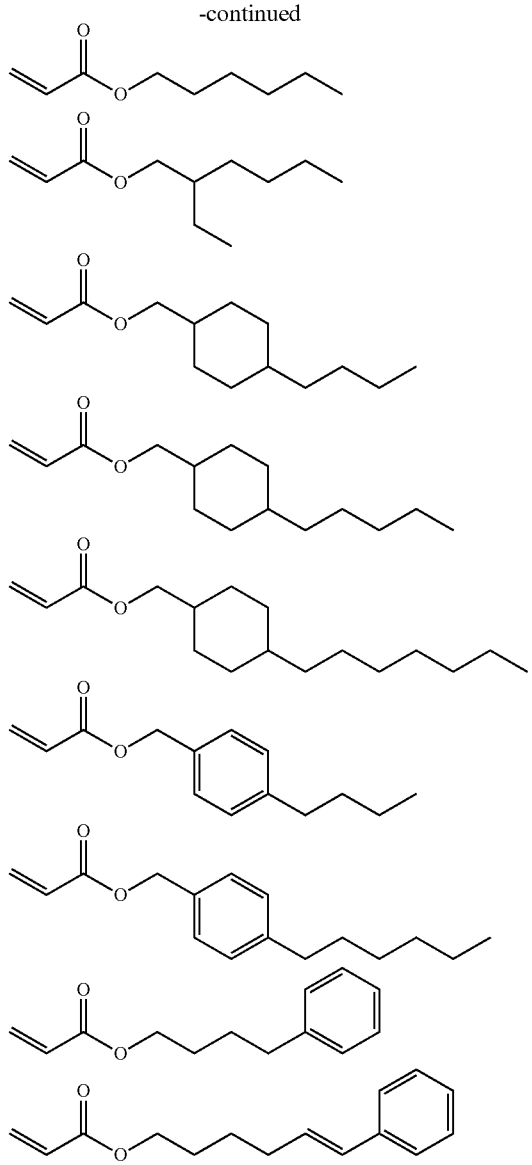

Regarding the content of the monofunctional radically polymerizable compound used in the present invention with respect to the total amount of all the radically polymerizable compounds in the curable composition for imprinting, the lower limit value is preferably 1 mass % or higher, more preferably 3 mass % or higher, still more preferably 5 mass % or higher, and still more preferably 7 mass % or higher. In addition, the upper limit value is preferably 29 mass % or lower, more preferably 27 mass % or lower, still more preferably 25 mass % or lower, still more preferably 20 mass % or lower, and still more preferably 15 mass % or lower. By adjusting the content of the monofunctional radically polymerizable compound with respect to the total amount of all the radically polymerizable compounds to be the above-described lower limit value or higher, releasability can be improved, and defects or mold breakage can be suppressed during mold release. In addition, by adjusting the content of the monofunctional radically polymerizable compound with respect to the total amount of all the radically polymerizable compounds to be the above-described upper limit value or lower, Tg of the cured film of the curable composition for imprinting can be increased, etching workability can be improved, in particular, the waving of a pattern during etching can be suppressed.

In the present invention, within a range not departing from the scope of the present invention, a monofunctional radically polymerizable compound other than the above-described monofunctional radically polymerizable compound may be used, and examples thereof include a monofunctional radically polymerizable compound described in JP2014-170949A, the contents of which are incorporated herein by reference.

In the present invention, the content of the monofunctional radically polymerizable compounds having the groups (1) to (3) is preferably 90 mass % or higher and more preferably 95 mass % or higher with respect to the total amount of all the monofunctional radically polymerizable compounds included in the curable composition for imprinting.

<Photoradical Polymerization Initiator>

The curable composition for imprinting according to the embodiment of the present invention includes a photoradical polymerization initiator.

As the photoradical polymerization initiator used in the present invention, any compound that generates an active species for polymerization of the above-described radically polymerizable compound by light irradiation can be used.

As the photoradical polymerization initiator, for example, a commercially available initiator can be used. For example, compounds described in paragraph "0091" of JP2008-105414A can be preferably adopted. An acetophenone compound, an acylphosphine oxide compound, or an oxime ester compound is preferable from the viewpoints of curing sensitivity and absorption properties. Examples of a commercially available product include IRGACURE (registered trade name) 1173, IRGACURE 184, IRGACURE 2959, IRGACURE 127, IRGACURE 907, IRGACURE 369, IRGACURE 379, LUCILIN (registered trade name) TPO, IRGACURE 819, IRGACURE OXE-01, IRGACURE OXE-02, IRGACURE 651, and IRGACURE 754 (all of which are manufactured by BASF SE).

In the present invention, an oxime compound having a fluorine atom can also be used as the photoradical polymerization initiator. Specific examples of the oxime compound having a fluorine atom include a compound described in JP2010-262028A, Compound 24 and 36 to 40 described in JP2014-500852A, and Compound (C-3) described in JP2013-164471A. The contents of this specification are incorporated herein by reference.

As the photoradical polymerization initiator, one kind may be used alone, but it is preferable that two or more kinds are used in combination. Specific examples include a combination of IRGACURE 1173 and IRGACURE 907, a combination of IRGACURE 1173 and LUCILIN TPO, a combination of IRGACURE 1173 and IRGACURE 819, a combination of IRGACURE 1173 and IRGACURE OXE01, a combination of IRGACURE 907 and LUCILIN TPO, a combination of IRGACURE 907 and IRGACURE 819. By using this combination, an exposure margin can be widened.

In the curable composition for imprinting used in the present invention, the content of the photoradical polymerization initiator is preferably 0.01 to 10 mass %, more preferably 0.1 to 5 mass %, and still more preferably 0.5 to 3 mass %. The curable composition for imprinting may include one photoradical polymerization initiator or two or more photoradical polymerization initiators. In a case where the infrared absorbing composition includes two or more photoradical polymerization initiators, it is preferable that the total content of the two or more photoradical polymerization initiators is in the above-described range.

<Sensitizer>

In addition to the photoradical polymerization initiator, a sensitizer may also be added to the curable composition for imprinting used in the present invention. In a case where it is difficult to cure the curable composition for imprinting according to the embodiment of the present invention in an oxygen atmosphere, curing properties can be improved by adding the sensitizer.

Preferable examples of the sensitizer include a compound belonging to the following compounds and having a maximum absorption wavelength in a wavelength range of 350 nm to 450 nm. Polynuclear aromatic compounds (for example, pyrene, perylene, triphenylene, anthracene, or phenanthrene), xanthenes (for example, fluorescein, eosin, erythrosine, Rhodamine B, or Rose Bengal), xanthones (for example, xanthone, thioxanthone, dimethylthioxanthone, diethylthioxanthone, 2-isopropylthioxanthone, or 2-chlorothioxanthone), cyanines (for example, thiocarbocyanine or oxacarbocyanine), merocyanines (for example, merocyanine or carbomerocyanine), rhodacyanines, oxonols, thiazines (for example, thionine, methylene blue, or toluidine blue), acridines (for example, acridine orange, chloroflavin, acridineflavin, or benzoflavin), acridones (for example, acridone or 10-butyl-2-chloroacridone), anthraquinones (for example, anthraquinone or 9,10-dibutoxyanthracene), squaryliums (for example, squarylium), styryls, benzostyiyls, coumarins (for example, 7-diethylamino-4-methylcoumarin or ketocoumarin), carbazoles (for example, N-vinylcarbazole), camphorquinones, and phenothiazines.

In addition, as a typical sensitizer which can be used in the present invention, for example, sensitizers disclosed in J. V. Crivello, Adv. in Polymer Sci., 62, 1 (1984) can be used.

Specific preferable examples of the sensitizer include pyrene, perylene, acridine orange, thioxanthone, 2-chlorothioxanthone, benzoflavin, N-vinylcarbazole, 9,10-dibutoxyanthracene, anthraquinone, coumarin, ketocoumarin, phenanthrene, camphorquinone, and phenothiazines.

In addition, in the present invention, compounds described in paragraphs "0043" to "0046" of 4937806B and paragraph "0036" of JP2011-003916A can be preferably used as the sensitizer.

In a case where the curable composition for imprinting according to the embodiment of the present invention includes the sensitizer, the addition amount of the sensitizer is preferably 30 to 200 parts by mass with respect to 100 parts by mass of the photoradical polymerization initiator.

The curable composition for imprinting according to the embodiment of the present invention may include one sensitizer or two or more sensitizers. In a case where the curable composition includes two or more sensitizers, it is preferable that the total content of the two or more sensitizers is in the above-described range.

<Release Agent>

The kind of the release agent used in the present invention is not particularly limited within a range not departing from the scope of the present invention. It is preferable that the release agent is an additive that is segregated at an interface with the mold and has a function of promoting release from the mold. Specific examples of the release agent include a surfactant and a non-polymerizable compound that has at least one hydroxyl group at a terminal or has a hydroxyl group having an etherified polyalkylene glycol structure and does not substantially include a fluorine atom and a silicon atom (hereinafter, also referred to as "non-polymerizable compound having releasability").

The composition may include one release agent or two or more release agents. In addition, in a case where the composition includes two or more release agents, the total content thereof is preferably 0.1 to 20 mass %, more preferably 1 to 10 mass %, and still more preferably 2 to 5 mass %.

<<Surfactant>>

As the surfactant, a nonionic surfactant is preferable.

The nonionic surfactant refers to a compound having at least one hydrophobic portion and at least one nonionic hydrophilic portion. Each of the hydrophobic portion and the hydrophilic portion may be present at a terminal of a molecule or in the molecule. The hydrophobic portion is formed of a hydrophobic group selected from the group consisting of a hydrocarbon group, a fluorine-containing group, and a Si-containing group, and the number of carbon atoms in the hydrophobic portion is preferably 1 to 25, more preferably 2 to 15, still more preferably 4 to 10, and still more preferably 5 to 8. It is preferable that the nonionic hydrophilic portion has at least one group selected from the group consisting of an alcoholic hydroxyl group, a phenolic hydroxyl group, an ether group (preferably a polyoxyalkylene group or a cyclic ether group), an amido group, an imido group, an ureido group, a urethane group, a cyano group, a sulfonamide group, a lactone group, a lactam group, and a cyclocarbonate group. As the nonionic surfactant, a hydrocarbon nonionic surfactant, a fluorine nonionic surfactant, a Si nonionic surfactant, or a fluorine-Si nonionic surfactant may be used, a fluorine nonionic surfactant or a Si nonionic surfactant is more preferable, a fluorine nonionic surfactant is still more preferable. Here, "fluorine-Si surfactant" refers to a surfactant having both requirements of a fluorine surfactant and a Si surfactant.

Examples of a commercially available product of the fluorine nonionic surfactant include: FLUORAD FC-4430 and FC-4431 (manufactured by Sumitomo 3M Ltd.); SURFLON S-241, S-242, and S-243 (manufactured by Asahi Glass Co., Ltd.); F-TOP EF-PN31M-03, EF-PN31M-04, EF-PN31M-05, EF-PN31M-06, and MF-100 (manufactured by Mitsubishi Materials Corporation); PolyFox PF-636, PF-6320, PF-656, and PF-6520 (manufactured by OMNOVA Solutions Inc.); FTERGENT 250, 251, 222F, 212M, and DFX-18 (manufactured by Neos Co., Ltd.); UNIDYNE DS-401, DS-403, DS-406, DS-451, and DSN-403N (manufactured by Daikin Industries, Ltd.); MEGAFACE F-430, F-444, F-477, F-553, F-556, F-557, F-559, F-562, F-565, F-567, F-569, and R-40 (manufactured by DIC Corporation); and Capstone FS-3100 and ZONYL FSO-100 (manufactured by DuPont).

In a case where the curable composition for imprinting according to the embodiment of the present invention includes the surfactant, the content of the surfactant is preferably 0.1 to 10 mass %, more preferably 0.2 to 5 mass %, and still more preferably 0.5 to 5 mass % with respect to the total content of the composition excluding the solvent. The curable composition for imprinting may include one surfactant or two or more surfactants. In a case where the infrared absorbing composition includes two or more non-polymerizable compounds having releasability, it is preferable that the total content of the two or more non-polymerizable compounds having releasability is in the above-described range.

<<Non-Polymerizable Compound having Releasability>>

The curable composition for imprinting may include a non-polymerizable compound that has at least one hydroxyl group at a terminal or has a hydroxyl group having an etherified polyalkylene glycol structure and does not substantially include a fluorine atom and a silicon atom. Here, the non-polymerizable compound refers to a compound not having a polymerizable group. In addition, substantially not including a fluorine atom and a silicon atom represents that, for example, the total content of a fluorine atom and a silicon atom is 1 mass % or lower, and it is preferable that a fluorine atom and a silicon atom are not completely included. By the curable composition for imprinting not including a fluorine atom and a silicon atom, compatibility with the polymerizable compound can be improved. In particular, in the curable composition for imprinting that does not substantially include the solvent, coating uniformity, pattern formability during imprint, and line edge roughness after dry etching are improved.

As the polyalkylene glycol structure included in the non-polymerizable compound having releasability, a polyalkylene structure that includes an alkylene group having 1 to 6 carbon atoms is preferable, a polyethylene glycol structure, a polypropylene glycol structure, a polybutylene glycol structure, or a mixed structure thereof is more preferable, a polyethylene glycol structure, a polypropylene glycol structure, or a mixed structure thereof is more preferable, and a polypropylene glycol structure is still more preferable.

Further, the non-polymerizable compound may substantially consist of only the polyalkylene glycol structure excluding the terminal substituent. Here, "substantially" represents that the content of components other than the polyalkylene glycol structure is 5 mass % or lower and preferably 1 mass % or lower with respect to the total content of the non-polymerizable compound having releasability. In particular, it is preferable that a compound that substantially consists of only the polypropylene glycol structure is included as the non-polymerizable compound having releasability.

As the polyalkylene glycol structure, it is preferable that 3 to 100 alkylene glycol constitutional units are included, it is more preferable that 4 to 50 alkylene glycol constitutional units are included, it is still more preferable that 5 to 30 alkylene glycol constitutional units are included, and it is even still more preferable that 6 to 20 alkylene glycol constitutional units are included.

It is preferable that the non-polymerizable compound having releasability has at least one hydroxyl group at a terminal or has a hydroxyl group that is etherified. As long as the non-polymerizable compound having releasability has at least one hydroxyl group at a terminal or has a hydroxyl group that is etherified, even in a case where the remaining terminal group is a hydroxyl group, a hydrogen atom in the terminal hydroxyl group may be substituted. As a group which may be substituted with the hydrogen atom in the terminal hydroxyl group, an alkyl group (that is, polyalkylene glycol alkyl ether) or an acyl group (that is, polyalkylene glycol ester) is preferable. A compound including a plurality of (preferably two or three) polyalkylene glycol chains through a linking group can also be preferably used.

Specific preferable examples of the non-polymerizable compound having releasability include polyethylene glycol, polypropylene glycol (for example, manufactured by Wako Pure Chemical Industries, Ltd.), mono- or dimethyl ether, mono- or dibutyl ether, mono- or dioctyl ether, mono- or dicetyl ether, monostearic acid ester, monooleic acid ester, polyoxyethylene glyceryl ether, polyoxypropylene glyceryl ether, and trimethyl ether thereof.

The weight-average molecular weight of the non-polymerizable compound having releasability is preferably 150 to 6000, more preferably 200 to 3000, still more preferably 250 to 2000, and still more preferably 300 to 1200.

In addition, examples of the non-polymerizable compound having releasability which can be used in the present invention include a non-polymerizable compound having releasability which has an acetylene diol structure. Examples of a commercially available product of the non-polymerizable compound having releasability include OLFINE E1010 (manufactured by Nissin Chemical Co., Ltd.).

In a case where the curable composition for imprinting according to the embodiment of the present invention includes the non-polymerizable compound having releasability, the content of the non-polymerizable compound having releasability is preferably 0.1 mass % or higher, more preferably 0.5 mass % or higher, still more preferably 1.0 mass % or higher, and still more preferably 2 mass % or higher with respect to the total content of the composition excluding the solvent. In addition, the content is preferably 20 mass % or lower, more preferably 10 mass % or lower, and still more preferably 5 mass % or lower.

The curable composition for imprinting may include one non-polymerizable compound having releasability or two or more non-polymerizable compounds having releasability. In a case where the infrared absorbing composition includes two or more non-polymerizable compounds having releasability, it is preferable that the total content of the two or more non-polymerizable compounds having releasability is in the above-described range.

<Antioxidant>

The curable composition for imprinting according to the embodiment of the present invention may include an antioxidant. Examples of the antioxidant include a phenol antioxidant, a phosphorus antioxidant, and a sulfur antioxidant.

Specific examples of the phenol antioxidant include 2,6-di-t-butyl-4-methylphenol, n-octadecyl-3-(3',5'-di-ti-butyl-4'-hydroxyphenyl)propionate, tetrakis [methyl ene-3-(3,5-di-t-butyl-4-hydroxyphenyl)propionate)methane, tris(3,5-di-t-butyl-4-hydroxybenzyl) isocyanurate, 4,4'-butylidene-bis(3-methyl-6-t-butylphenol), triethyleneglycol-bis [3-(3-t-butyl-4-hydroxy-5-methylphenyl)propionate], and 3,9-bis{2-[3-(3-t-butyl-4-hydroxy-5-methylphenyl)propionyloxy]-1,1-dimethylethyl}-2,4,8,10-tetraoxaspiro [5,5]undecane.

Examples of a commercially available product of the phenol antioxidant include: IRGANOX 1010, IRGANOX 1035, IRGANOX 1076, IRGANOX 1135, IRGANOX 245, IRGANOX 259, IRGANOX 295, and IRGANOX 3114 (all of which are manufactured by BASF SE); ADEKA STAB AO-20, ADEKA STAB AO-30, ADEKA STAB AO-40, ADEKA STAB AO-50, ADEKA STAB AO-60, ADEKA STAB AO-70, ADEKA STAB AO-80, ADEKA STAB AO-90, and ADEKA STAB AO-330 (all of which are manufactured by Adeka Corporation); SUMILIZER BHT, SUMILIZER BP-101, SUMILIZER GA-80, SUMILIZER MDP-S, SUMILIZER BBM-S, SUMILIZER GM, SUMILIZER GS(F), and SUMILIZER GP (all of which are manufactured by Sumitomo Chemical Co., Ltd.); HOSTANOX 010, HOSTANOX 016, HOSTANOX 014, and HOSTANOX 03 (all of which are manufactured by Clariant AG); ANTAGE BHT, ANTAGE W-300, ANTAGE W-400, and ANTAGE W500 (all of which are manufactured by Kawaguchi Chemical Industry Co., Ltd.); SEENOX 224M and SEENOX 326M (all of which are manufactured by Shipro Kasei Co., Ltd.); YOSHINOX BHT, YOSHINOX BB, and TOMINOX TT, and TOMINOX 917 (all of which are manufactured by Yoshitomiyakuhin Corporation); and TTHP (Toray Industries Inc.).

Specific examples of the phosphorus antioxidant include trisnonylphenylphosphite, tris(2,4-di-t-butylphenyl)phosphite, distearylpentaerythritoldiphosphite, bis(2,4-di-t-butylphenyl)pentaerythritol phosphite, bis(2,6-di-t-butyl-4-methylphenyl)pentaerythritol phosphite, 2,2-methylenebis(4,6-di-t-butylphenyl)octyl phosphite, and tetrakis(2,4-di-t-butylphenyl)-4,4-biphenylene-di-phosphite. Examples of a commercially available product of the phosphorus antioxidant include ADEKA STAB 1178 (manufactured by Adeka. Corporation), SUMILIZER TNP (manufactured by Sumitomo Chemical Co., Ltd.), JP-135 (manufactured by Johoku Chemical Co., Ltd.), ADEKA STAB 2112 (manufactured by Adeka Corporation), JPP-2000 (manufactured by Johoku Chemical Co., Ltd.), Weston 618 (manufactured by GE), ADEKA PEP-24G (manufactured by Adeka Corporation), ADEKA PEP-36 (manufactured by Adeka Corporation), ADEKA STAB HP-10 (manufactured by Adeka Corporation), Sandstab P-EPQ (manufactured by Sandoz), and PHOSPHITE 168 (manufactured by BASF SE).

Specific examples of the sulfur antioxidant include dilauryl-3,3'-thiodipropionate, dimyristyl 3,3'-thiodipropionate, distearyl 3,3'-thiodipropionate, and pentaerythritol tetrakis (3-laurylthiopropionate). Examples of a commercially available product of the sulfur antioxidant include SUMILIZER TPL (manufactured by Sumitomo Chemical Co., Ltd.), YOSHINOX DLTP (manufactured by Yoshitomiyakuhin Corporation), ANTIOX L (manufactured by NOF Corporation), SUMILIZER TPM (manufactured by Sumitomo Chemical Co., Ltd.), YOSHINOX DMTP (manufactured by Yoshitomiyakuhin Corporation), ANTIOX M (manufactured by NOF Corporation), SUMILIZER TPS (manufactured by Sumitomo Chemical Co., Ltd.), YOSHINOX DSTP (manufactured by Yoshitomiyakuhin Corporation), ANTIOX S (manufactured by NOF Corporation), ADEKA STAB AO-412S (manufactured by Adeka Corporation). SEENOX 412S (manufactured by Shipro Kasei Co., Ltd.), and SUMILIZER TDP (manufactured by Sumitomo Chemical Co., Ltd.).

In addition, an antioxidant used in Examples described below can be preferably used.

In a case where the antioxidant is added, the content of the antioxidant is preferably 0.001 to 5 mass % with respect to the curable composition for imprinting. The curable composition for imprinting according to the embodiment of the present invention may include one antioxidant or two or more antioxidants. In a case where the curable composition includes two or more antioxidants, it is preferable that the total content of the two or more antioxidants is in the above-described range.

<Other Components>

In addition to the above-described components, the curable composition for imprinting used in the present invention may further include a polymerization inhibitor (for example, 4-hydroxy-2,2,6,6-tetramethylpiperidine-1-oxyl free radical), an ultraviolet absorber, a solvent, and the like within a range not departing from the scope of the present invention. As each of these compounds, only one kind may be included, and two or more kinds may be included. The details of the other components can be found in paragraphs "0061" to "0064" of JP2014-170949A, the contents of which are incorporated herein by reference.

In the curable composition for imprinting according to the embodiment of the present invention, the content of a component having a weight-average molecular weight of higher than 2000 is 5 mass % or lower, preferably 3 mass % or lower, more preferably 1 mass % or lower, and still more preferably 0.1 mass % or lower.

<Properties of Curable Composition for Imprinting>

The viscosity of the curable composition for imprinting according to the embodiment of the present invention at 25° C. is preferably 15 mPa·s or lower, more preferably 13 mPa·s or lower, still more preferably 11 mPa·s or lower, still more preferably 9 mPa·s or lower, and still more preferably 8 mPa·s or lower. The lower limit value of the viscosity is not particularly limited and is, for example, 3 mPa·s or higher and preferably 5 mPa·s or higher. In the above-described range, the curable composition for imprinting according to the embodiment of the present invention can be easily filled into the mold, and the mold filling time can be reduced. Further, pattern formability and throughput can also be improved.

The Ohnishi parameter of the curable composition for imprinting according to the embodiment of the present invention is preferably 3.8 or lower, more preferably 3.7 or lower, still more preferably 3.6 or lower, still more preferably 3.5 or lower, and still more preferably 3.4 or lower. The lower limit value of the Ohnishi parameter is not particularly limited and is, for example, the above-described lower limit value or higher. By adjusting the Ohnishi parameter to be the above-described upper limit value or lower, etching workability can be improved, in particular, pattern disconnection after etching can be more effectively suppressed.

The glass transition temperature of the curable composition for imprinting according to the embodiment of the present invention after curing is preferably 100° C. or higher, more preferably 120° C. or higher, and still more preferably 150° C. or higher. The upper limit value of the glass transition temperature is not particularly limited and is, for example, 350° C. or lower.

The curable composition for imprinting according to the embodiment of the present invention may be filtered before use. For filtering, for example, a polytetrafluoroethylene (PTFE) filter can be used. In addition, the pore size of the filter is preferably 0.003 µm to 5.0 µm. The details of filtering can be found in paragraph "0070" of JP2014-170949A, the contents of which are incorporated herein by reference.

As a storage container of the curable composition for imprinting according to the embodiment of the present invention a well-known storage container of the related art can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

The curable composition for imprinting according to the embodiment of the present invention is used as a cured product that is photocured. More specifically, the curable composition for imprinting according to the embodiment of the present invention is used to form a pattern using a photoimprint method.

<Pattern Forming Method>

A pattern forming method according to an embodiment of the present invention includes: applying the curable composition for imprinting according to the embodiment of the present invention to a substrate or a mold; and irradiating the curable composition for imprinting with light in a state where the curable composition for imprinting is interposed between the mold and the substrate.

In the pattern forming method according to the embodiment of the present invention, a pattern is applied to a substrate or a mold. The application method is not particularly limited, and the details thereof can be found in paragraph "0102" of JP2010-109092A (corresponding to US2011/199592A), the contents of which are incorporated herein by reference. In the present invention, a spin coating method or an ink jet method is preferable.

The substrate is not particularly limited, and the details thereof can be found in paragraph "0103" of JP2010-109092A (corresponding to US2011/199592A), the contents of which are incorporated herein by reference. Specifically, a silicon substrate, a glass substrate, a sapphire substrate, a silicon carbide substrate, a gallium nitride substrate, a metal aluminum substrate, an amorphous aluminum oxide substrate, a polycrystalline aluminum oxide substrate, or a substrate formed of GaAsP, GaP, AlGaAs, InGaN, GaN, AlGaN, ZnSe, AlGaInP, or ZnO can be used. Specific examples of a material of the glass substrate include aluminosilicate glass, aluminoborosilicate glass, and barium borosilicate glass.

In the present invention, a silicon substrate is preferable.

The mold is not particularly limited, and the details thereof can be found in paragraphs "0105" to "0109" of JP2010-109092A (corresponding to US2011/199592A), the contents of which are incorporated herein by reference. In the present invention, a quartz mold is preferable. In the pattern (line width) of the mold used in the present invention, a size is preferably 50 nm or less.

Next, the curable composition for imprinting is irradiated with light in a state where the curable composition for imprinting is interposed between the mold and the substrate. A step of pressing the curable composition for imprinting into contact with the substrate or the mold can be preferably performed in a noble gas atmosphere, in a reduced pressure atmosphere, or in a noble gas atmosphere under reduced pressure. Here, the reduced pressure atmosphere refers to a state in a space under a pressure lower than the atmospheric pressure (101325 Pa), and the pressure is preferably 1000 Pa or lower, more preferably 100 Pa or lower, and still more preferably 1 Pa or lower. In a case where noble gas is used, helium is preferable. The exposure dose is preferably in a range of 5 mJ/cm$^2$ to 1000 mJ/cm$^2$.

Here, it is preferable that the curable composition for imprinting according to the embodiment of the present invention is heated to be cured after light irradiation. In addition, an underlayer film-forming composition may be provided between the substrate and the curable composition layer for imprinting. That is, the curable composition for imprinting (further the cured product according to the embodiment of the present invention) may be directly provided on a surface of the substrate or the mold, or may be provided on the substrate or the mold through one or more layers.

The details of other configurations of the pattern forming method can be found in paragraphs "0103" to "0115" of JP2010-109092A (corresponding to US2011/199592A), the contents of which are incorporated herein by reference.

In the pattern forming method according to the embodiment of the present invention, a fine pattern can be formed using a photoimprint method (more preferably, a photo-nanoimprint method) with high accuracy at a low cost. Therefore, a pattern that can be formed using a photolithography technique in the related art can be formed with high accuracy at a low cost. For example, the pattern according to the embodiment of the present invention is also applicable to a permanent film such as an overcoat layer or an insulating film that is used in a liquid crystal display (LCD) or the like, a semiconductor integrated circuit, a recording material, or an etching resist in a flat panel display or the like. In particular, the pattern formed using the pattern forming method according to the embodiment of the present invention has excellent etching resistance and can be preferably used as an etching resist of dry etching in which fluorocarbon or the like is used.

In a permanent film (a resist for a structural member) that is used in a liquid crystal display (LCD) or the like or a resist that is used for processing a substrate of an electronic material, in order to prevent interference with an operation of a product, it is preferable to avoid incorporation of ionic impurities of a metal or an organic matter in a resist as much as possible. Therefore, the concentration of the ionic impurities of the metal or the organic matter in the curable composition for imprinting used in the present invention is preferably 1 mass ppm (parts per million) or lower, more preferably 100 mass ppb (parts per billion) or lower, still more preferably 10 mass ppb or lower, and still more preferably 100 mass ppt or lower.

Examples of a method of removing ionic impurities of a metal or an organic matter from the curable composition for imprinting include filtration using a filter. The pore size of the filter is preferably 10 nm or less, more preferably 5 nm or less, and still more preferably 3 nm or less. As a material of the filter, polytetrafluoroethylene, polyethylene, or nylon is preferable. The filter may be washed with an organic solvent in advance. In a filter filtration step, plural kinds of filters may be connected in series or in parallel. In a case where plural kinds of filters are used, filters having different pore sizes and/or formed of different materials may be used in combination. In addition, various materials may be filtered multiple times, and a step of filtering various materials multiple times may be a cycle filtration step.

In addition, examples of a method of reducing impurities such as metal from the various materials include a method of performing distillation under conditions where contamination is reduced as much as possible, for example, by selecting materials having a low metal content as raw materials constituting the various materials, filtering raw materials constituting the various materials through a filter, or lining the inside of a device with TEFLON (registered trade name). Preferable conditions for the filtration of filtering raw materials constituting the various materials through a filter are the same as the above-described conditions.

Impurities may be removed using an absorbent instead of filtration using a filter, or filtration using a filter and the method using an absorbent may be used in combination. As the absorbent, a well-known absorbent can be used, and examples thereof include an inorganic absorbent such as silica gel or zeolite, and an organic absorbent such as activated carbon.

<Pattern>

The pattern formed using the pattern forming method according to the embodiment of the present invention can be used as a permanent film used in a LCD or the like or an etching resist for processing a semiconductor. In addition, by forming a grid pattern on a glass substrate of a LCD using the pattern according to the embodiment of the present invention, a polarizing plate having small reflection or absorption and having a large screen size (for example, 55 inch or more than 60 inch) can be manufactured at a low cost. For example, a polarizing plate described in JP2015-132825A or WO2011/132649 can be manufactured. 1 inch is 25.4 mm.

In addition, the permanent film may be bottled in a container such as a gallon bottle or a coated bottle to be transported or stored after formation. In this case, in order to prevent deterioration, for example, the inside of the container may be replaced with inert nitrogen or argon. In addition, the temperature during transport or storage may be normal temperature or may be controlled to be in a range of −20° C. to 0° C. in order to further prevent deterioration of the permanent film. Of course, it is preferable to shield light on a level where a reaction does not progress.

Specifically, the pattern according to the embodiment of the present invention can be preferably used for manufacturing a recording medium such as a magnetic disk, a light-receiving element such as a solid image pickup element, a light-emitting element such as an LED or organic EL, an optical device such as a LCD, a diffraction grating, a relief hologram, an optical component such as an optical waveguide, an optical filter, and a microlens array, a thin film transistor, an organic transistor, a color filter, an anti-reflection film, a polarizing plate, a polarizing element, a polarization element, an optical film, a flat panel display member such as a column material, a nanobiodevice, an immunological analysis chip, a deoxyribonucleic acid (DNA) separation chip, a microreactor, photonic liquid crystals, a guide pattern for forming a fine pattern (directed self-assembly, DSA) using self-assembly of a block copolymer, or the like.

A pattern that is formed using the pattern forming method according to the embodiment of the present invention is useful as an etching resist (mask for lithography). In a case where the pattern is used as an etching resist, first, a silicon substrate (for example, silicon wafer) on which a thin film such as $SiO_2$ is formed is used as a substrate, and, for example, a nano or micro-order fine pattern is formed on the substrate using the pattern forming method according to the embodiment of the present invention. In the present invention, in particular, a nano-order fine pattern can be formed. Further, a pattern having a size of 50 nm or less, in particular, 30 nm or less can also be formed. The lower limit value of a pattern size formed using the pattern forming method according to the embodiment of the present invention is not particularly limited and may be, for example, 1 nm or more.

Next, the substrate is etched by using etching gas, for example, hydrogen fluoride or the like in the case of wet etching or $CF_4$ in the case of dry etching. As a result, a desired pattern can be formed on the substrate. The pattern has excellent etching resistance to, in particular, dry etching. That is, the pattern that is formed using the manufacturing method according to the embodiment of the present invention is preferably used as a mask for etching. In addition, the present invention discloses a method of manufacturing a substrate to be processed, the method including performing etching by using a pattern which is obtained using the pattern forming method according to the embodiment of the present invention as a mask.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples.

Synthesis Example

<<Intermediate G-9A>>

Compound G-9A

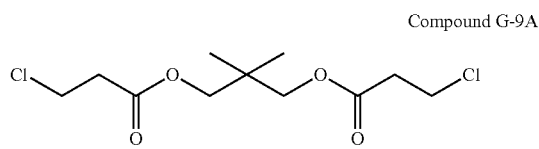 [SMILES: CC(C)(COC(=O)CCCl)COC(=O)CCCl]

158.5 g (1.25 mol) of 3-chloropropionyl chloride and 0.1 L of acetonitrile were put into a 5 L three-neck flask under the flow of $N_2$ and were cooled at −10° C. 59.4 g (0.57 mol) of neopentyl glycol and a mixture of 122.1 g (1.40 mol) of dimethylacetamide and 0.1 L of acetonitrile were added dropwise for 2 hours at a temperature where the internal temperature of the three-neck flask was not higher than 0° C. Further, the solution was aged at 0° C. for 2 hours. Next, the solution was cooled to −10° C., and 0.5 L of distilled water was added dropwise for 0.5 hours at a temperature where the internal temperature of the three-neck flask was not higher than 0° C. Further, 2.0 L of ethyl acetate was added, and the solution was strongly stirred for 30 minutes. Next, the solution was left to stand to remove the water layer, 1.0 L of distilled water was added, and the solution was strongly stirred for 30 minutes. Next, the solution was left to stand to remove the water layer, 1.0 L of 1 M HCl was added, and the solution was strongly stirred for 30 minutes. Next, the solution was left to stand to remove the water layer. The obtained organic layer was concentrated under reduced pressure to obtain a compound (G-9A).

<<Intermediate G-9>>

50 g (0.18 mol) of G-9A, 38 g (0.18 mol) of LIGHT ACRYLATE NP-A (manufactured by Kyoeisha Chemical Co., Ltd.), and 0.2 L of acetonitrile were put into a 2 L three-neck flask under the flow of $N_2$ and were cooled at −10° C. 13 g (0.18 mol) of diethylamine was added dropwise for 2 hours at a temperature where the internal temperature of the three-neck flask was not higher than 0° C. Further, the solution was aged at 0° C. for 5 hours. Next, the solution was cooled to −10° C., and 0.5 L of distilled water was added dropwise for 0.5 hours at a temperature where the internal temperature of the flask was not higher than 0° C. Further, 2.0 L of ethyl acetate was added, and the solution was strongly stirred for 30 minutes. Next, the solution was left to stand to remove the water layer, 1.0 L of distilled water was added, and the solution was strongly stirred for 30 minutes. Next, the solution was left to stand to remove the water layer. The obtained organic layer was concentrated under reduced pressure and was purified by silica gel chromatography to obtain a compound (G-9).

G-9

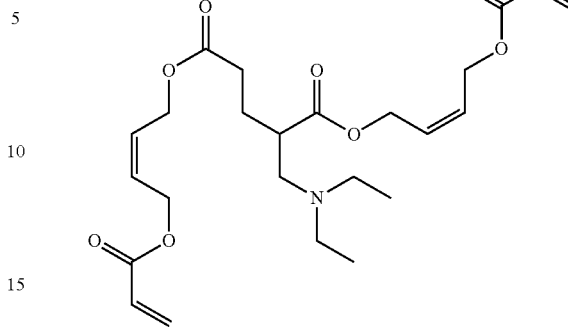

<G-1 to G-7 and G-9 to G-40)>
Using the same method as that of G-9, G-1 to G-7 and G-9 to G-40 were also synthesized.

EXAMPLES AND COMPARATIVE EXAMPLES

<Preparation of Curable Compositions for Imprinting>

The respective compounds (in the table, compounds to which A, B, C, D, or G was added) shown in Tables 2 to 4 below were mixed with each other. Further, 4-hydroxy-2,2,6,6-tetramethylpiperidine-1-oxyl free radical (manufactured by Tokyo Chemical Industry Co., Ltd.) was added as a polymerization inhibitor such that the content thereof 200 mass ppm (0.02 mass %) with respect to 100 mass % of the polymerizable compounds (the total amount of the compounds of A, B, and G in the table). This mixture was filtered through a polytetrafluoroethylene (PTFE) filter having a pore size of 0.1 μm. As a result, a curable composition for imprinting was prepared. The addition amounts of the respective components in Tables 2 to 4 are represented by mass ratios.

The obtained curable composition for imprinting was evaluated as follows. The results are shown in Table 5.

<Viscosity>

The viscosity of the curable composition for imprinting (before curing) and the polyfunctional radically polymerizable compound were measured at 25° C. using a RE-80L type rotary viscometer (manufactured by Toki Sangyo Co., Ltd.).

The rotation speed during the measurement was as shown in Table 1 below depending on the viscosity.

TABLE 1

| Viscosity | Appropriate Rotation Speed |
|---|---|
| 0.001 to 6.076 mPa · s | 100 rpm |
| 6.077 to 12.15 mPa · s | 50 rpm |
| 12.16 to 30.38 mPa · s | 20 rpm |
| 30.39 to 60.76 mPa · s | 10 rpm |
| 60.77 to 121.5 mPa · s | 5 rpm |
| 121.6 to 303.8 mPa · s | 2 rpm |
| 303.9 to 607.6 mPa · s | 1 rpm |
| 607.7 to 1215 mPa · s | 0.5 rpm |
| 1216 to 2025 mPa · s | 0.3 rpm |

In a case where the viscosity (25° C.) of each of the curable compositions for imprinting according to Examples 1 to 43 was measured under the above-described measurement conditions, it was found that the viscosity was in a range of 3 to 15 mPa·s.

<Adhesiveness>

The adhesive strength between the substrate and the cured product for imprinting was evaluated as follows.

Each of the curable compositions for imprinting according to Examples and Comparative Examples having an adjusted temperature of 25° C. was applied to a SOC (Spun On Carbon) surface formed on a silicon wafer using an ink jet printer: DMP-2831 (manufactured by Fuji Film Dimatix Inc.) in a liquid droplet amount of 1 pl per nozzle such that the liquid droplets formed a square array having an interval of about 100 μm on the above-described adhesive film.

A quartz mold having a line/space with a line width of 30 nm and a depth of 60 nm was placed to come into contact with the curable composition layer for imprinting, and the curable composition for imprinting was exposed from the quartz wafer side using a high pressure mercury lamp under a condition of 300 mJ/cm². After the exposure, the quartz mold was released. At this time, a peeled area % was measured.

This peeled area % corresponds to the adhesive strength F (unit: N).

A: peeled area≤1%
B: 5%>peeled area>1%
C: peeled area≥5%

<Releasing Force>

As a quartz mold, a quartz mold having a line/space with a line width of 30 nm and a depth of 60 nm was used. Using an ink jet printer (DMP-2831, manufactured by Fujifilm Dimatix Inc.) as an ink jet device, the above-described curable composition for imprinting was applied to a silicon wafer using an ink jet method, and was interposed between the mold and the silicon wafer in a helium atmosphere. The curable composition for imprinting was exposed from the quartz mold side using a high pressure mercury lamp under a condition of 100 mJ/cm², and then the quartz mold was released. As a result, a pattern (hereinafter, referred to as "sample") having a pattern size (line width) of 30 nm was obtained. The thickness of the remaining film of the sample (the height of the pattern) was 60 nm. In addition, the force (releasing force F) required to release the quartz mold at this time was measured.

The evaluation was performed based on the following evaluation segments.

A: F≤12 N
B: 12 N<F≤18 N
C: F>18 N

<Storage Stability>

After leaving each of the curable compositions for imprinting according to Examples and Comparative Examples to stand in an atmosphere at 40° C. for 1 week, a decrease ratio in the purity of each of the components in the composition was measured, and a total decrease ratio thereof was evaluated as stability.

The evaluation was performed based on the following evaluation segments.

A: total decrease ratio≤1%
B: 5%>total decrease ratio>1%
C: total decrease ratio≥5%

TABLE 2

|  | Example 1 | Example 2 | Example 3 | Example 4 | Example 5 | Example 6 | Example 7 | Example 8 |
|---|---|---|---|---|---|---|---|---|
| A-1 (Part(s) by Mass) | 10.0 | | | | | | | |
| A-2 (Part(s) by Mass) | | 10.0 | | | | | | |
| A-3 (Part(s) by Mass) | | | 10.0 | | | | | |
| A-4 (Part(s) by Mass) | | | | 10.0 | | | | |
| A-5 (Part(s) by Mass) | | | | | 10.0 | | | |
| A-6 (Part(s) by Mass) | | | | | | 10.0 | | |
| A-7 (Part(s) by Mass) | | | | | | | 10.0 | |
| A-8 (Part(s) by Mass) | | | | | | | | 10.0 |
| A-9 (Part(s) by Mass) | | | | | | | | |
| A-10 (Part(s) by Mass) | | | | | | | | |
| A-11 (Part(s) by Mass) | | | | | | | | |
| A-12 (Part(s) by Mass) | | | | | | | | |
| A-13 (Part(s) by Mass) | | | | | | | | |
| B-1 (Part(s) by Mass) | 84.9 | | | | | | | |
| B-2 (Part(s) by Mass) | | 84.9 | | | | | | |
| B-3 (Part(s) by Mass) | | | 84.9 | | | | | |
| B-4 (Part(s) by Mass) | | | | 84.9 | | | | |
| B-5 (Part(s) by Mass) | | | | | 84.9 | | | |
| B-6 (Part(s) by Mass) | | | | | | 84.9 | | |
| B-7 (Part(s) by Mass) | | | | | | | 84.9 | |
| B-8 (Part(s) by Mass) | | | | | | | | 84.9 |
| B-9 (Part(s) by Mass) | | | | | | | | |
| B-10 (Part(s) by Mass) | | | | | | | | |
| B-11 (Part(s) by Mass) | | | | | | | | |
| B-12 (Part(s) by Mass) | | | | | | | | |
| B-13-1 (Part(s) by Mass) | | | | | | | | |
| B-14-1 (Part(s) by Mass) | | | | | | | | |
| B-15 (Part(s) by Mass) | | | | | | | | |
| C-1 (Part(s) by Mass) | 2.0 | | | | 2.0 | | | |
| C-2 (Part(s) by Mass) | | | | 2.0 | | 2.0 | | |
| C-3 (Part(s) by Mass) | | | 2.0 | | | | 2.0 | |
| C-4 (Part(s) by Mass) | | 2.0 | | | | | | 2.0 |
| C-5 (Part(s) by Mass) | | | | | | | | |
| D-1 (Part(s) by Mass) | 3.0 | | | | | | 3.0 | |
| D-2 (Part(s) by Mass) | | 3.0 | | | | | | |
| D-3 (Part(s) by Mass) | | | | 3.0 | | | | 3.0 |
| D-4 (Part(s) by Mass) | | | | | 3.0 | | | |

TABLE 2-continued

| | Ex 1 | Ex 2 | Ex 3 | Ex 4 | Ex 5 | Ex 6 | Ex 7 | Ex 8 |
|---|---|---|---|---|---|---|---|---|
| D-5 (Part(s) by Mass) | | 3.0 | | | | | | |
| D-6 (Part(s) by Mass) | | | | | 3.0 | | | |
| G-1 (Part(s) by Mass) | 0.100 | | | | | | | |
| G-2 (Part(s) by Mass) | | 0.099 | | | | | | |
| G-3 (Part(s) by Mass) | | | 0.100 | | | | | |
| G-4 (Part(s) by Mass) | | | | 0.100 | | | | |
| G-5 (Part(s) by Mass) | | | | | 0.100 | | | |
| G-6 (Part(s) by Mass) | | | | | | 0.100 | | |
| G-7 (Part(s) by Mass) | | | | | | | 0.100 | |
| G-8 (Part(s) by Mass) | | | | | | | | 0.100 |
| G-9 (Part(s) by Mass) | | | | | | | | |
| G-10 (Part(s) by Mass) | | | | | | | | |
| G-11 (Part(s) by Mass) | | | | | | | | |
| G-12 (Part(s) by Mass) | | | | | | | | |
| G-13-1 (Part(s) by Mass) | | | | | | | | |
| G-14-1 (Part(s) by Mass) | | | | | | | | |
| G-15 (Part(s) by Mass) | | | | | | | | |
| G-40 (Part(s) by Mass) | | 0.001 | | | | | | |

| | Example 9 | Example 10 | Example 11 | Example 12 | Example 13 | Example 14 | Example 15 |
|---|---|---|---|---|---|---|---|
| A-1 (Part(s) by Mass) | | | | | | 10.0 | |
| A-2 (Part(s) by Mass) | | | | | | | 10.0 |
| A-3 (Part(s) by Mass) | | | | | | | |
| A-4 (Part(s) by Mass) | | | | | | | |
| A-5 (Part(s) by Mass) | | | | | | | |
| A-6 (Part(s) by Mass) | | | | | | | |
| A-7 (Part(s) by Mass) | | | | | | | |
| A-8 (Part(s) by Mass) | | | | | | | |
| A-9 (Part(s) by Mass) | 10.0 | | | | | | |
| A-10 (Part(s) by Mass) | | 10.0 | | | | | |
| A-11 (Part(s) by Mass) | | | 10.0 | | | | |
| A-12 (Part(s) by Mass) | | | | 10.0 | | | |
| A-13 (Part(s) by Mass) | | | | | 10.0 | | |
| B-1 (Part(s) by Mass) | | | | | | | |
| B-2 (Part(s) by Mass) | | | | | | | |
| B-3 (Part(s) by Mass) | | | | | | | |
| B-4 (Part(s) by Mass) | | | | | | | |
| B-5 (Part(s) by Mass) | | | | | | | |
| B-6 (Part(s) by Mass) | | | | | | | |
| B-7 (Part(s) by Mass) | | | | | | | |
| B-8 (Part(s) by Mass) | | | | | | | |
| B-9 (Part(s) by Mass) | 84.9 | | | | | | |
| B-10 (Part(s) by Mass) | | 84.9 | | | | | |
| B-11 (Part(s) by Mass) | | | 84.9 | | | | |
| B-12 (Part(s) by Mass) | | | | 84.9 | | | |
| B-13-1 (Part(s) by Mass) | | | | | 84.9 | | |
| B-14-1 (Part(s) by Mass) | | | | | | 84.9 | |
| B-15 (Part(s) by Mass) | | | | | | | 84.9 |
| C-1 (Part(s) by Mass) | | | | | 2.0 | 1.0 | |
| C-2 (Part(s) by Mass) | | | | 2.0 | | 1.0 | 1.0 |
| C-3 (Part(s) by Mass) | | | 2.0 | | | | |
| C-4 (Part(s) by Mass) | | 2.0 | | | | | 1.0 |
| C-5 (Part(s) by Mass) | 2.0 | | | | | | |
| D-1 (Part(s) by Mass) | | | | | | | 3.0 |
| D-2 (Part(s) by Mass) | | | 3.0 | | | | |
| D-3 (Part(s) by Mass) | 3.0 | 3.0 | | | | | |
| D-4 (Part(s) by Mass) | | | | 3.0 | | | |
| D-5 (Part(s) by Mass) | | | | | | 3.0 | |
| D-6 (Part(s) by Mass) | | | | | 3.0 | | |
| G-1 (Part(s) by Mass) | | | | | | | |
| G-2 (Part(s) by Mass) | | | | | | | |
| G-3 (Part(s) by Mass) | | | | | | | |
| G-4 (Part(s) by Mass) | | | | | | | |
| G-5 (Part(s) by Mass) | | | | | | | |
| G-6 (Part(s) by Mass) | | | | | | | |
| G-7 (Part(s) by Mass) | | | | | | | |
| G-8 (Part(s) by Mass) | | | | | | | |

TABLE 2-continued

| | | | | | | | |
|---|---|---|---|---|---|---|---|
| G-9 (Part(s) by Mass) | 0.100 | | | | | | |
| G-10 (Part(s) by Mass) | | 0.100 | | | | | |
| G-11 (Part(s) by Mass) | | | 0.100 | | | | |
| G-12 (Part(s) by Mass) | | | | 0.100 | | | |
| G-13-1 (Part(s) by Mass) | | | | | 0.100 | | |
| G-14-1 (Part(s) by Mass) | | | | | | 0.100 | |
| G-15 (Part(s) by Mass) | | | | | | | 0.100 |
| G-40 (Part(s) by Mass) | | | | | | | |

TABLE 3

| | Example 16 | Example 17 | Example 18 | Example 19 | Example 20 | Example 21 | Example 22 | Example 23 |
|---|---|---|---|---|---|---|---|---|
| A-1 (Part(s) by Mass) | | | | | | | | |
| A-2 (Part(s) by Mass) | | | | | | | | |
| A-3 (Part(s) by Mass) | 10.0 | | | | | | | |
| A-4 (Part(s) by Mass) | | 10.0 | | | | | | |
| A-5 (Part(s) by Mass) | | | 10.0 | | | | | |
| A-6 (Part(s) by Mass) | | | | 10.0 | | | | |
| A-7 (Part(s) by Mass) | | | | | 10.0 | | | |
| A-8 (Part(s) by Mass) | | | | | | 10.0 | | |
| A-9 (Part(s) by Mass) | | | | | | | 10.0 | |
| A-10 (Part(s) by Mass) | | | | | | | | 10.0 |
| A-11 (Part(s) by Mass) | | | | | | | | |
| A-12 (Part(s) by Mass) | | | | | | | | |
| A-13 (Part(s) by Mass) | | | | | | | | |
| B-16 (Part(s) by Mass) | 84.9 | | | | | | | |
| B-17 (Part(s) by Mass) | | 84.9 | | | | | | |
| B-18 (Part(s) by Mass) | | | 84.9 | | | | | |
| B-19 (Part(s) by Mass) | | | | 84.9 | | | | |
| B-20 (Part(s) by Mass) | | | | | 84.9 | | | |
| B-21 (Part(s) by Mass) | | | | | | 84.9 | | |
| B-22 (Part(s) by Mass) | | | | | | | 84.9 | |
| B-23 (Part(s) by Mass) | | | | | | | | 84.9 |
| B-24 (Part(s) by Mass) | | | | | | | | |
| B-25 (Part(s) by Mass) | | | | | | | | |
| B-26 (Part(s) by Mass) | | | | | | | | |
| B-27 (Part(s) by Mass) | | | | | | | | |
| B-28 (Part(s) by Mass) | | | | | | | | |
| B-29 (Part(s) by Mass) | | | | | | | | |
| B-30 (Part(s) by Mass) | | | | | | | | |
| C-1 (Part(s) by Mass) | | | 1.0 | | 1.0 | | 1.0 | |
| C-2 (Part(s) by Mass) | 1.0 | 1.0 | | | | 2.0 | | 1.5 |
| C-3 (Part(s) by Mass) | 1.0 | | 1.0 | 1.0 | 1.0 | | 1.0 | |
| C-4 (Part(s) by Mass) | | 1.0 | | | | | | 0.5 |
| C-5 (Part(s) by Mass) | | | | 1.0 | | | | |
| D-1 (Part(s) by Mass) | | | | | | | | |
| D-2 (Part(s) by Mass) | 3.0 | 3.0 | 3.0 | 3.0 | | | | |
| D-3 (Part(s) by Mass) | | | | | | | | |
| D-4 (Part(s) by Mass) | | | | | 3.0 | 3.0 | 3.0 | 3.0 |
| D-5 (Part(s) by Mass) | | | | | | | | |
| G-16 (Part(s) by Mass) | 0.100 | | | | | | | |
| G-17 (Part(s) by Mass) | | 0.100 | | | | | | |
| G-18 (Part(s) by Mass) | | | 0.100 | | | | | |
| G-19 (Part(s) by Mass) | | | | 0.100 | | | | |
| G-20 (Part(s) by Mass) | | | | | 0.100 | | | |
| G-21 (Part(s) by Mass) | | | | | | 0.100 | | |
| G-22 (Part(s) by Mass) | | | | | | | 0.100 | |
| G-23 (Part(s) by Mass) | | | | | | | | 0.100 |
| 6-24 (Part(s) by Mass) | | | | | | | | |
| G-25 (Part(s) by Mass) | | | | | | | | |
| G-26 (Part(s) by Mass) | | | | | | | | |
| G-27 (Part(s) by Mass) | | | | | | | | |
| G-28 (Part(s) by Mass) | | | | | | | | |
| G-29 (Part(s) by Mass) | | | | | | | | |
| G-30 (Part(s) by Mass) | | | | | | | | |

| | Example 24 | Example 25 | Example 26 | Example 27 | Example 28 | Example 29 | Example 30 |
|---|---|---|---|---|---|---|---|
| A-1 (Part(s) by Mass) | | | | | | | |
| A-2 (Part(s) by Mass) | | | | | | | |
| A-3 (Part(s) by Mass) | | | | | | | |
| A-4 (Part(s) by Mass) | | | | | | | |

TABLE 3-continued

| | | | | | | | |
|---|---|---|---|---|---|---|---|
| A-5 (Part(s) by Mass) | | | | | | | |
| A-6 (Part(s) by Mass) | | | | | | | |
| A-7 (Part(s) by Mass) | | | | | | | |
| A-8 (Part(s) by Mass) | | | | | | | |
| A-9 (Part(s) by Mass) | | | | | | | |
| A-10 (Part(s) by Mass) | | | | | | | |
| A-11 (Part(s) by Mass) | 10.0 | | | | | | 10.0 |
| A-12 (Part(s) by Mass) | | 10.0 | | | | 10.0 | |
| A-13 (Part(s) by Mass) | | | 10.0 | 10.0 | 10.0 | | |
| B-16 (Part(s) by Mass) | | | | | | | |
| B-17 (Part(s) by Mass) | | | | | | | |
| B-18 (Part(s) by Mass) | | | | | | | |
| B-19 (Part(s) by Mass) | | | | | | | |
| B-20 (Part(s) by Mass) | | | | | | | |
| B-21 (Part(s) by Mass) | | | | | | | |
| B-22 (Part(s) by Mass) | | | | | | | |
| B-23 (Part(s) by Mass) | | | | | | | |
| B-24 (Part(s) by Mass) | 84.9 | | | | | | |
| B-25 (Part(s) by Mass) | | 84.9 | | | | | |
| B-26 (Part(s) by Mass) | | | 84.9 | | | | |
| B-27 (Part(s) by Mass) | | | | 84.9 | | | |
| B-28 (Part(s) by Mass) | | | | | 84.9 | | |
| B-29 (Part(s) by Mass) | | | | | | 84.9 | |
| B-30 (Part(s) by Mass) | | | | | | | 84.9 |
| C-1 (Part(s) by Mass) | | | 1.0 | | | 1.0 | |
| C-2 (Part(s) by Mass) | 1.0 | 1.0 | 1.0 | 1.5 | | | 2.0 |
| C-3 (Part(s) by Mass) | 1.0 | 1.0 | | 0.5 | 1.0 | 1.0 | |
| C-4 (Part(s) by Mass) | | | | | 1.0 | | |
| C-5 (Part(s) by Mass) | | | | | | | |
| D-1 (Part(s) by Mass) | | | | | | | |
| D-2 (Part(s) by Mass) | | | | | | | |
| D-3 (Part(s) by Mass) | 3.0 | 3.0 | 3.0 | 3.0 | | | |
| D-4 (Part(s) by Mass) | | | | | 3.0 | 3.0 | 3.0 |
| D-5 (Part(s) by Mass) | | | | | | | |
| G-16 (Part(s) by Mass) | | | | | | | |
| G-17 (Part(s) by Mass) | | | | | | | |
| G-18 (Part(s) by Mass) | | | | | | | |
| G-19 (Part(s) by Mass) | | | | | | | |
| G-20 (Part(s) by Mass) | | | | | | | |
| G-21 (Part(s) by Mass) | | | | | | | |
| G-22 (Part(s) by Mass) | | | | | | | |
| G-23 (Part(s) by Mass) | | | | | | | |
| G-24 (Part(s) by Mass) | 0.100 | | | | | | |
| G-25 (Part(s) by Mass) | | 0.100 | | | | | |
| G-26 (Part(s) by Mass) | | | 0.100 | | | | |
| G-27 (Part(s) by Mass) | | | | 0.100 | | | |
| G-28 (Part(s) by Mass) | | | | | 0.100 | | |
| G-29 (Part(s) by Mass) | | | | | | 0.100 | |
| G-30 (Part(s) by Mass) | | | | | | | 0.100 |

TABLE 4

| | Example 31 | Example 32 | Example 33 | Example 34 | Example 35 | Example 36 | Example 37 | Example 38 |
|---|---|---|---|---|---|---|---|---|
| A-1 (Part(s) by Mass) | | | | | 10.0 | 10.0 | 10.0 | 10.0 |
| A-2 (Part(s) by Mass) | 10.0 | 10.0 | 10.0 | 10.0 | | | | |
| A-3 (Part(s) by Mass) | | | | | | | | |
| A-4 (Part(s) by Mass) | | | | | | | | |
| A-5 (Part(s) by Mass) | | | | | | | | |
| A-6 (Part(s) by Mass) | | | | | | | | |
| A-7 (Part(s) by Mass) | | | | | | | | |
| A-8 (Part(s) by Mass) | | | | | | | | |
| B-1 (Part(s) by Mass) | | | | | | | | |
| B-2 (Part(s) by Mass) | 82.0 | | | | | | | |
| B-3 (Part(s) by Mass) | | | | | | | | |
| B-4 (Part(s) by Mass) | | | | | | | | |
| B-5 (Part(s) by Mass) | | | | | | | | |
| B-6 (Part(s) by Mass) | | | | | | | | |
| B-7 (Part(s) by Mass) | | | | | | | | |
| B-8 (Part(s) by Mass) | | | | | | | | |
| B-17 (Part(s) by Mass) | | | | | | | | |
| B-31 (Part(s) by Mass) | 84.9 | | | | | | | |
| B-32 (Part(s) by Mass) | | 84.9 | | | | | | |
| B-33 (Part(s) by Mass) | | | 84.9 | | | | | |
| B-34 (Part(s) by Mass) | | | | 84.9 | | | | |
| B-35 (Part(s) by Mass) | | | | | 84.9 | | | |

TABLE 4-continued

| | | | | | | | | |
|---|---|---|---|---|---|---|---|---|
| B-36 (Part(s) by Mass) | | | | | | 84.9 | | |
| B-37 (Part(s) by Mass) | | | | | | | 84.9 | |
| B-38 (Part(s) by Mass) | | | | | | | | 84.9 |
| C-1 (Part(s) by Mass) | 1.0 | 1.0 | 1.0 | | 1.0 | | | |
| C-2 (Part(s) by Mass) | | | | 1.0 | | 2.0 | 2.0 | 2.0 |
| C-3 (Part(s) by Mass) | 1.0 | | | 1.0 | 1.0 | | | |
| C-4 (Part(s) by Mass) | | 1.0 | 1.0 | | | | | |
| C-5 (Part(s) by Mass) | | | | | | | | |
| D-1 (Part(s) by Mass) | | | | | | | | |
| D-2 (Part(s) by Mass) | | | | | | | | |
| D-3 (Part(s) by Mass) | | | | | | | | 3.0 |
| D-4 (Part(s) by Mass) | | | | | | | | |
| D-5 (Part(s) by Mass) | 3.0 | 3.0 | 3.0 | | | | | |
| D-6 (Part(s) by Mass) | | | | 3.0 | 3.0 | 3.0 | 3.0 | |
| G-1 (Part(s) by Mass) | | | | | | | | |
| G-2 (Part(s) by Mass) | | | | | | | | |
| G-3 (Part(s) by Mass) | | | | | | | | |
| G-4 (Part(s) by Mass) | | | | | | | | |
| G-5 (Part(s) by Mass) | | | | | | | | |
| G-6 (Part(s) by Mass) | | | | | | | | |
| G-7 (Part(s) by Mass) | | | | | | | | |
| G-8 (Part(s) by Mass) | | | | | | | | |
| G-17 (Part(s) by Mass) | | | | | | | | |
| G-31 (Part(s) by Mass) | 0.100 | | | | | | | |
| G-32 (Part(s) by Mass) | | 0.100 | | | | | | |
| G-33 (Part(s) by Mass) | | | 0.100 | | | | | |
| G-34 (Part(s) by Mass) | | | | 0.100 | | | | |
| G-35 (Part(s) by Mass) | | | | | 0.100 | | | |
| G-36 (Part(s) by Mass) | | | | | | 0.100 | | |
| G-37 (Part(s) by Mass) | | | | | | | 0.100 | |
| G-38 (Part(s) by Mass) | | | | | | | | 0.100 |
| G-39 (Part(s) by Mass) | | | | | | | | |
| G-40 (Part(s) by Mass) | | | | | | | | |
| Tributyl Amine (Part(s) by Mass) | | | | | | | | |

| | Example 39 | Example 40 | Example 41 | Example 42 | Example 43 | Example 44 | Comparative Example 1 |
|---|---|---|---|---|---|---|---|
| A-1 (Part(s) by Mass) | | | | | | 10.0 | 10.0 |
| A-2 (Part(s) by Mass) | | | | | | | |
| A-3 (Part(s) by Mass) | 10.0 | 10.0 | 10.0 | | 2.5 | | |
| A-4 (Part(s) by Mass) | | | | | | | |
| A-5 (Part(s) by Mass) | | | | | | | |
| A-6 (Part(s) by Mass) | | | | 5.0 | | | |
| A-7 (Part(s) by Mass) | | | | | | | |
| A-8 (Part(s) by Mass) | | | | | 2.5 | | |
| B-1 (Part(s) by Mass) | 84.9 | 84.9 | 84.9 | | | 84.0 | 84.9 |
| B-2 (Part(s) by Mass) | | | | 82.0 | | | |
| B-3 (Part(s) by Mass) | | | | | | | |
| B-4 (Part(s) by Mass) | | | | | | | |
| B-5 (Part(s) by Mass) | | | | | | | |
| B-6 (Part(s) by Mass) | | | | | | | |
| B-7 (Part(s) by Mass) | | | | | | | |
| B-8 (Part(s) by Mass) | | | | 7.9 | | | |
| B-17 (Part(s) by Mass) | | | | | 45.0 | | |
| B-31 (Part(s) by Mass) | | | | | | | |
| B-32 (Part(s) by Mass) | | | | | | | |
| B-33 (Part(s) by Mass) | | | | | | | |
| B-34 (Part(s) by Mass) | | | | | | | |
| B-35 (Part(s) by Mass) | | | | | | | |
| B-36 (Part(s) by Mass) | | | | | | | |
| B-37 (Part(s) by Mass) | | | | | 45.0 | | |
| B-38 (Part(s) by Mass) | | | | | | | |
| C-1 (Part(s) by Mass) | | | | | | 2.0 | 2.0 |
| C-2 (Part(s) by Mass) | 2.0 | 2.0 | 2.0 | 1.0 | 1.0 | | |
| C-3 (Part(s) by Mass) | | | | | | | |
| C-4 (Part(s) by Mass) | | | | 1.0 | 1.0 | | |
| C-5 (Part(s) by Mass) | | | | | | | |
| D-1 (Part(s) by Mass) | | | | | | 3.0 | 3.0 |
| D-2 (Part(s) by Mass) | | | | | | | |
| D-3 (Part(s) by Mass) | 3.0 | 3.0 | 3.0 | 3.0 | 3.0 | | |
| D-4 (Part(s) by Mass) | | | | | | | |
| D-5 (Part(s) by Mass) | | | | | | | |
| D-6 (Part(s) by Mass) | | | | | | | |
| G-1 (Part(s) by Mass) | | | | | | 1.0 | |
| G-2 (Part(s) by Mass) | | | | | | | |
| G-3 (Part(s) by Mass) | | | | 0.080 | | | |
| G-4 (Part(s) by Mass) | | | | | | | |

TABLE 4-continued

| | | | |
|---|---|---|---|
| G-5 (Part(s) by Mass) | | | |
| G-6 (Part(s) by Mass) | | | |
| G-7 (Part(s) by Mass) | | | |
| G-8 (Part(s) by Mass) | | 0.010 | |
| G-17 (Part(s) by Mass) | | | 0.050 |
| G-31 (Part(s) by Mass) | | | |
| G-32 (Part(s) by Mass) | | | |
| G-33 (Part(s) by Mass) | | | |
| G-34 (Part(s) by Mass) | | | |
| G-35 (Part(s) by Mass) | | | |
| G-36 (Part(s) by Mass) | | | |
| G-37 (Part(s) by Mass) | | | 0.050 |
| G-38 (Part(s) by Mass) | | | |
| G-39 (Part(s) by Mass) | 0.100 | 0.050 | |
| G-40 (Part(s) by Mass) | | 0.100 | 0.050 |
| Tributyl Amine (Part(s) by Mass) | | | 0.100 |

TABLE 5

| | Adhesiveness | Releasing Force | Storage Stability |
|---|---|---|---|
| Example 1 | A | A | A |
| Example 2 | B | A | A |
| Example 3 | A | B | A |
| Example 4 | A | A | A |
| Example 5 | A | A | A |
| Example 6 | B | A | A |
| Example 7 | A | A | A |
| Example 8 | A | A | A |
| Example 9 | A | A | A |
| Example 10 | A | A | A |
| Example 11 | A | A | A |
| Example 12 | A | A | A |
| Example 13 | A | A | A |
| Example 14 | A | A | A |
| Example 15 | A | A | A |
| Example 16 | A | A | A |
| Example 17 | A | A | A |
| Example 18 | A | A | A |
| Example 19 | A | A | A |
| Example 20 | A | A | A |
| Example 21 | A | A | A |
| Example 22 | A | A | A |
| Example 23 | A | A | A |
| Example 24 | A | A | A |
| Example 25 | B | A | A |
| Example 26 | A | A | A |
| Example 27 | A | A | A |
| Example 28 | A | A | A |
| Example 29 | A | A | A |
| Example 30 | A | B | A |
| Example 31 | A | B | A |
| Example 32 | A | B | A |
| Example 33 | A | A | A |
| Example 34 | A | A | A |
| Example 35 | A | A | A |
| Example 36 | A | A | A |
| Example 37 | A | A | A |
| Example 38 | A | B | A |
| Example 39 | B | A | A |
| Example 40 | B | A | A |
| Example 41 | B | A | A |
| Example 42 | A | A | A |
| Example 43 | A | A | A |
| Example 44 | A | B | A |
| Comparative Example 1 | C | C | B |

Compounds used in Tables 2 to 4 are as follows. The compounds represented by Formula (1) are respective compounds represented by G-X (X represents the ordinal number; hereinafter, the same shall be applied) excluding G-1-13 and G-1-14. The compounds represented by Formula (2) are respective compounds represented by B-X excluding B-1-13 and B-1-14. The monofunctional radically polymerizable compounds are compounds represented by A-X in Table 6 below. The photoradical polymerization initiators are compounds represented by C-X in Table 7. The release agents are compounds represented by D-X in Table 8 below.

TABLE 6

| No. | Structural Formula | Manufacturer and Trade Name or Synthesis Method | Ohnishi Parameter | Boiling Point (° C.) (Value at 667 Pa) | Viscosity (mPa•s) at 257° C. |
|---|---|---|---|---|---|
| A-1 | (acrylate structure) | Osaka Organic Chemical Indusiry Ltd., Trade Name: NOAA | 3.7 | 91 | 1.9 |
| A-2 | (acrylate structure) | Kyoeisha Chemical Co., Ltd., Trade Name: LIGHTACRYLATE L-A | 3.5 | 137 | 3.9 |
| A-3 | (acrylate structure) | Synthesized from 4-Octylbenzyl Alcohol and Acryloylchloride | 2.9 | >160 | 5.6 |

TABLE 6-continued

| No. | Structural Formula | Manufacturer and Trade Name or Synthesis Method | Ohnishi Parameter | Boiling Point (° C.) (Value at 667 Pa) | Viscosity (mPa·s) at 257° C. |
|---|---|---|---|---|---|
| A-4 | | Nippon Shokubai Co., Ltd., Trade Name: 2-Ethylhexyl Acrylate (AEH) | 3.7 | 87 | 1.6 |
| A-5 | | | 2.7 | >160 | 10 |
| A-6 | | Synthesized from 4-Butylbenzyl Alcohol and Acryloylchloride | 2.8 | 160 | 3.9 |
| A-7 | | Mitsubishi Chemical Corporation, Trade Name: Butyl Acrylate (BA) | 4.2 | <50 | 0.9 |
| A-8 | | Osaka Organic Chemical Industry Ltd., Trade Name: VISCOAT # 160 | 2.8 | 84 | 2.3 |
| A-9 | | Osaka Organic Chemical Industry Ltd., Trade Name: VISCOAT # 192 | 3.3 | 130 | 8.3 |
| A-10 | | Osaka Organic Chemical Industry Ltd., Trade Name: IBXA | 3.2 | 96 | 7.1 |
| A-11 | | Osaka Organic Chemical Industry Ltd., Trade Name: MADA | 3.0 | 149 | 31.7 |
| A-12 | | Kyoeisha Chemical Co., Ltd., Trade Name: LIGHT ACRYLATE HOA (N) | 8.0 | 77 | 5.3 |
| A-13 | | Unimatec Corporation, Trade Name: FAAC-6 | 2.2 | 69 | 4.1 |

The Ohnishi parameter was measured from the following expression.

Ohnishi Parameter = (Sum of Numbers of C, H, and O Atoms)/(Number of C Atoms-Number of O Atoms)

Compound B-13-1
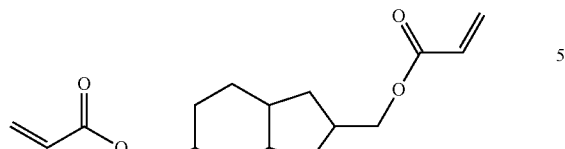
Compound B-14-1
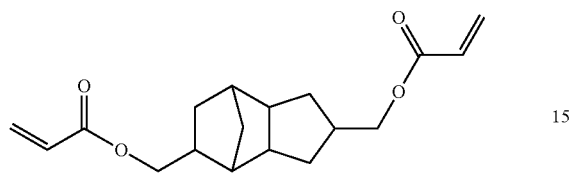
TABLE 7
| No. | Structural Formula | Manufacturer and Trade Name or Synthesis Method |
|---|---|---|
| C-1 | ![structure] | BASF, Trade Name IRGACURE 819 |
| C-2 | ![structure] | BASF, Trade NAme: IRGACURE OXE-01 |
| C-3 | ![structure] | BASF, Trade NAme: IRGACURE 1173 |
| C-4 | ![structure] | Tokyo Chemical Industry Co., Ltd., BHT |
| C-5 | ![structure] | Lamberti S. p. A., ESACURE ITX |

TABLE 8

| No. | Structural Formula | Manufacturer and Trade Name or Synthesis Method |
|---|---|---|
| D-1 | Fluorine-Containing Surfactant having PEO Structure | Neos Co., Ltd., Trade Name: FTERGENT 212M |
| D-2 | Fluorine-Containing Surfactant having PEO Structure | Dupont. Trade Name: Capstone FS-3100 |
| D-3 | H—(OC$_3$H$_6$)$_n$—OH<br>Mn ~ 700 | Adeka Corporation, ADEKA POLYETHER P-700 |
| D-4 | CH$_3$—(OC$_3$H$_6$)$_n$—OCH$_3$<br>Mn ~ 728 | Synthesized by Methylation of Both Ends ADEKA POLYETHER P-700 |
| D-5 | H$_3$CO—(C$_3$H$_8$O)$_l$—[...]—(OC$_3$H$_8$)$_n$—OCH$_3$<br>(OC$_3$H$_8$)$_m$—OCH$_3$<br>Mn ~742 | Synthesized by Methylation of Terminal ADEKA POLYETHER G-700 |
| D-6 | [structure with (OCH$_2$CH$_2$)$_m$OH and (OCH$_2$CH$_2$)$_n$OH, m + n - 10] | Nissin Chemical Co., Ltd., Trade Name: OLFINE E1010 |

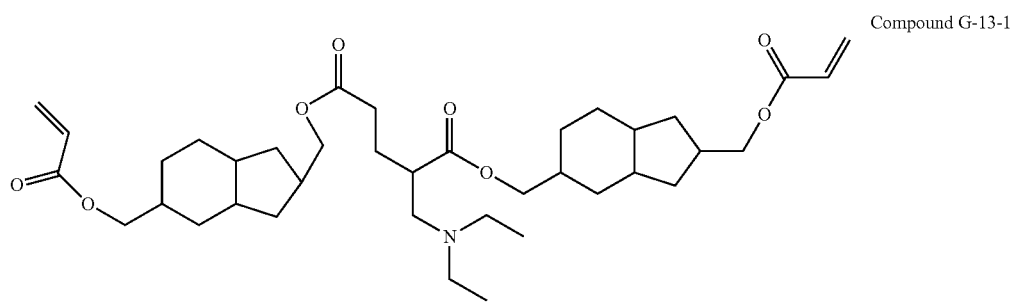

Compound G-13-1

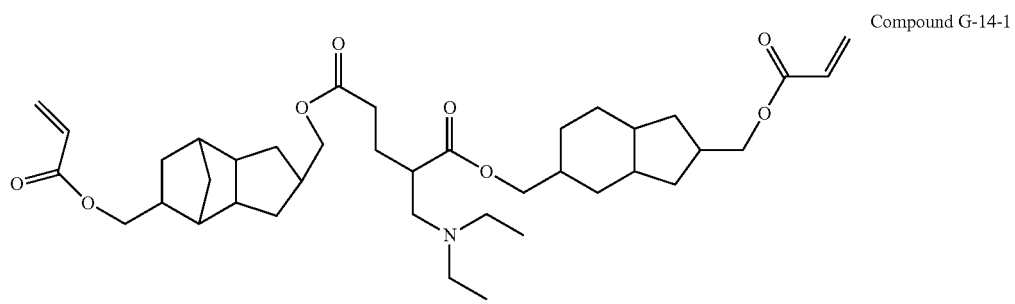

Compound G-14-1

As clearly seen from Table 5 and the like, in the curable composition for imprinting according to the embodiment of the present invention, the adhesiveness between the cured product and the substrate was excellent, and the storage stability of the curable composition for imprinting itself was excellent.

Further, in the curable composition for imprinting according to the present invention, the mold releasability was also excellent.

In addition, it can be seen from the above results that the curable composition for imprinting according to the embodiment of the present invention can be used as a material of a cured product or a pattern used for various applications and the cured product and the pattern can be suitably used particularly as a mask for lithography.

On the other hand, in the curable compositions for imprinting according to Comparative Examples not including the compound represented by Formula (1), the adhesiveness between the cured product and the substrate and the storage stability of the curable composition for imprinting were poor.

What is claimed is:

1. A curable composition for imprinting comprising:
a compound represented by the following Formula (1);
a radically polymerizable compound other than the compound represented by Formula (1); and
a photoradical polymerization initiator,

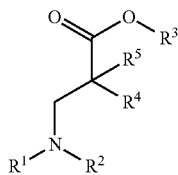

(1)

in Formula (1), $R^1$ and $R^2$ each independently represents a hydrogen atom or an organic group having 1 to 8 carbon atoms and may be bonded to each other to form a ring, $R^3$ represents a monovalent organic group, and $R^4$ and $R^5$ each independently represents a hydrogen atom or a monovalent organic group, provided that either $R^4$ or $R^5$ in Formula (1) is represented by the following Formula (1-3),

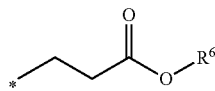

(1-3)

in Formula (1-3), $R^6$ represents a monovalent organic group and * represents a binding site.

2. The curable composition for imprinting according to claim 1,
wherein the content of the compound represented by Formula (1) is 0.005 to 1 part by mass with respect to 100 parts by mass of the radically polymerizable compound other than the compound represented by Formula (1).

3. The curable composition for imprinting according to claim 1,
wherein the radically polymerizable compound other than the compound represented by Formula (1) includes at least one (meth)acryloyl group.

4. The curable composition for imprinting according to claim 1,
wherein the molecular weight of the compound represented by Formula (1) is 100 to 1500.

5. The curable composition for imprinting according to claim 1,
wherein the compound represented by Formula (1) has a radically polymerizable group.

6. The curable composition for imprinting according to claim 1,
wherein $R^3$ in Formula (1) and $R^6$ in Formula (1-3) are each independently represented by the following Formula (1-1),

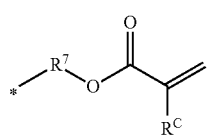

(1-1)

in the formula, $R^7$ represents a divalent organic group, $R^C$ represents a hydrogen atom or a methyl group, and * represents a binding site.

7. The curable composition for imprinting according to claim 1,
wherein at least one radically polymerizable compound other than the compound represented by Formula (1) includes a compound represented by the following Formula (2),

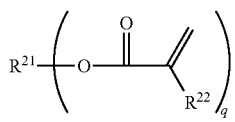

(2)

in Formula (2), $R^{21}$ represents a q-valent organic group, $R^{22}$ represents a hydrogen atom or a methyl group, and q represents an integer of 2 or more.

8. The curable composition for imprinting according to claim 1,
wherein at least one radically polymerizable compound other than the compound represented by Formula (1) is a monofunctional (meth)acrylic monomer.

9. The curable composition for imprinting according to claim 1,
wherein a content of a solvent in the curable composition for imprinting is 5 mass % or lower.

10. The curable composition for imprinting according to claim 1,
wherein a content of a component having a weight-average molecular weight of higher than 2000 in the curable composition for imprinting is 5 mass % or lower.

11. The curable composition for imprinting according to claim 1,
wherein the viscosity of the curable composition for imprinting at 25° C. is 3 to 15 mPa·s.

12. A cured product which is formed of the curable composition for imprinting according to claim 1.

13. The cured product according to claim 12, which is provided on a silicon substrate.

14. A patterned cured product forming method comprising:
applying the curable composition for imprinting according to claim 1 to a substrate or a mold with a pattern; and
forming the patterned cured product by irradiating the curable composition for imprinting with light in a state where the curable composition for imprinting is interposed between the mold and the substrate.

15. The patterned cured product forming method according to claim 14,
wherein the size of the pattern of the obtained patterned cured product is 30 nm or less.

16. A method of manufacturing a substrate to be processed comprising:
performing etching by using a patterned cured product which is obtained using the patterned cured product forming method according to claim 14 as a mask.

17. A patterned cured product which is formed of the curable composition according to claim 1,
wherein the size of the patterned cured product is 30 nm or less.

18. A mask for etching comprising:
at least one patterned cured product according to claim 17.

19. A polymerizable composition for imprinting comprising:
a compound represented by the following Formula (1); and
a compound represented by the following Formula (2),

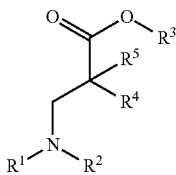
(1)

in Formula (1), $R^1$ and $R^2$ each independently represents a hydrogen atom or an organic group having 1 to 8 carbon atoms and may be bonded to each other to form a ring, $R^3$ represents a monovalent organic group, and $R^4$ and $R^5$ each independently represents a hydrogen atom or a monovalent organic group, provided that either $R^4$ or $R^5$ in Formula (1) is represented by the following Formula (1-3),

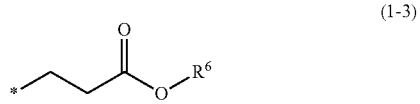
(1-3)

in Formula (1-3), $R^6$ represents a monovalent organic group and * represents a binding site, and

(2)

in Formula (2), $R^{21}$ represents a q-valent organic group, $R^{22}$ represents a hydrogen atom or a methyl group, and q represents an integer of 2 or more.

* * * * *